US010818756B2

(12) United States Patent
Lee et al.

(10) Patent No.: US 10,818,756 B2
(45) Date of Patent: Oct. 27, 2020

(54) VERTICAL TRANSPORT FET HAVING MULTIPLE THRESHOLD VOLTAGES WITH ZERO-THICKNESS VARIATION OF WORK FUNCTION METAL

(71) Applicant: INTERNATIONAL BUSINESS MACHINES CORPORATION, Armonk, NY (US)

(72) Inventors: Choonghyun Lee, Rensselaer, NY (US); Kangguo Cheng, Schenectady, NY (US); Juntao Li, Cohoes, NY (US); Shogo Mochizuki, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/178,725

(22) Filed: Nov. 2, 2018

(65) Prior Publication Data
US 2020/0144378 A1     May 7, 2020

(51) Int. Cl.
| H01L 29/36 | (2006.01) |
| H01L 21/8234 | (2006.01) |
| H01L 29/10 | (2006.01) |
| H01L 27/088 | (2006.01) |
| H01L 29/66 | (2006.01) |

(52) U.S. Cl.
CPC ...... *H01L 29/36* (2013.01); *H01L 21/823431* (2013.01); *H01L 21/823487* (2013.01); *H01L 27/088* (2013.01); *H01L 29/1037* (2013.01); *H01L 29/66803* (2013.01)

(58) Field of Classification Search
CPC ............... H01L 29/66803; H01L 21/823431

USPC ................................. 257/329, 347
See application file for complete search history.

(56) References Cited

U.S. PATENT DOCUMENTS

| 7,993,999 B2 * | 8/2011 | Basker ................. H01L 21/845 438/151 |
| 9,117,899 B2 | 8/2015 | Harrington, III et al. |
| 9,299,835 B1 | 3/2016 | Anderson et al. |
| 9,490,161 B2 | 11/2016 | Doris et al. |
| 9,502,265 B1 | 11/2016 | Jiang et al. |
| 9,514,990 B2 | 12/2016 | Liu et al. |
| 9,837,405 B1 * | 12/2017 | Cheng ................ H01L 27/0886 |
| 9,984,937 B1 * | 5/2018 | Bi ................... H01L 21/823487 |
| 10,103,147 B1 * | 10/2018 | Bao .................. H01L 29/78642 |
| 2015/0311109 A1 | 10/2015 | Doris et al. |
| 2016/0247731 A1 * | 8/2016 | Balakrishnan ...... H01L 21/3083 |
| 2017/0288056 A1 * | 10/2017 | Balakrishnan ...... H01L 29/7827 |

(Continued)

FOREIGN PATENT DOCUMENTS

CN          103681326 A       3/2014

OTHER PUBLICATIONS

Lee, et al.; "Understanding the Interfacial Layer Formation on Strained Si1-xGex Channels and Their Correlation to Inversion Layer Hole Mobility"; Symposium on VLSI Technology Digest of Technical Papers; IBM Research; 2017; 2 pages.

Primary Examiner — David Vu
Assistant Examiner — Brandon C Fox
(74) Attorney, Agent, or Firm — Cantor Colburn LLP

(57) ABSTRACT

A technique relates to a semiconductor device. Fins are formed of varying concentrations of germanium. Gate material is formed on the fins. Source or drain (S/D) regions are adjacent to the fins, and transistor devices include the fins.

20 Claims, 19 Drawing Sheets

(56) References Cited

U.S. PATENT DOCUMENTS

2018/0019337 A1 1/2018 Xie et al.
2018/0053847 A1 2/2018 Balakrishnan et al.

* cited by examiner

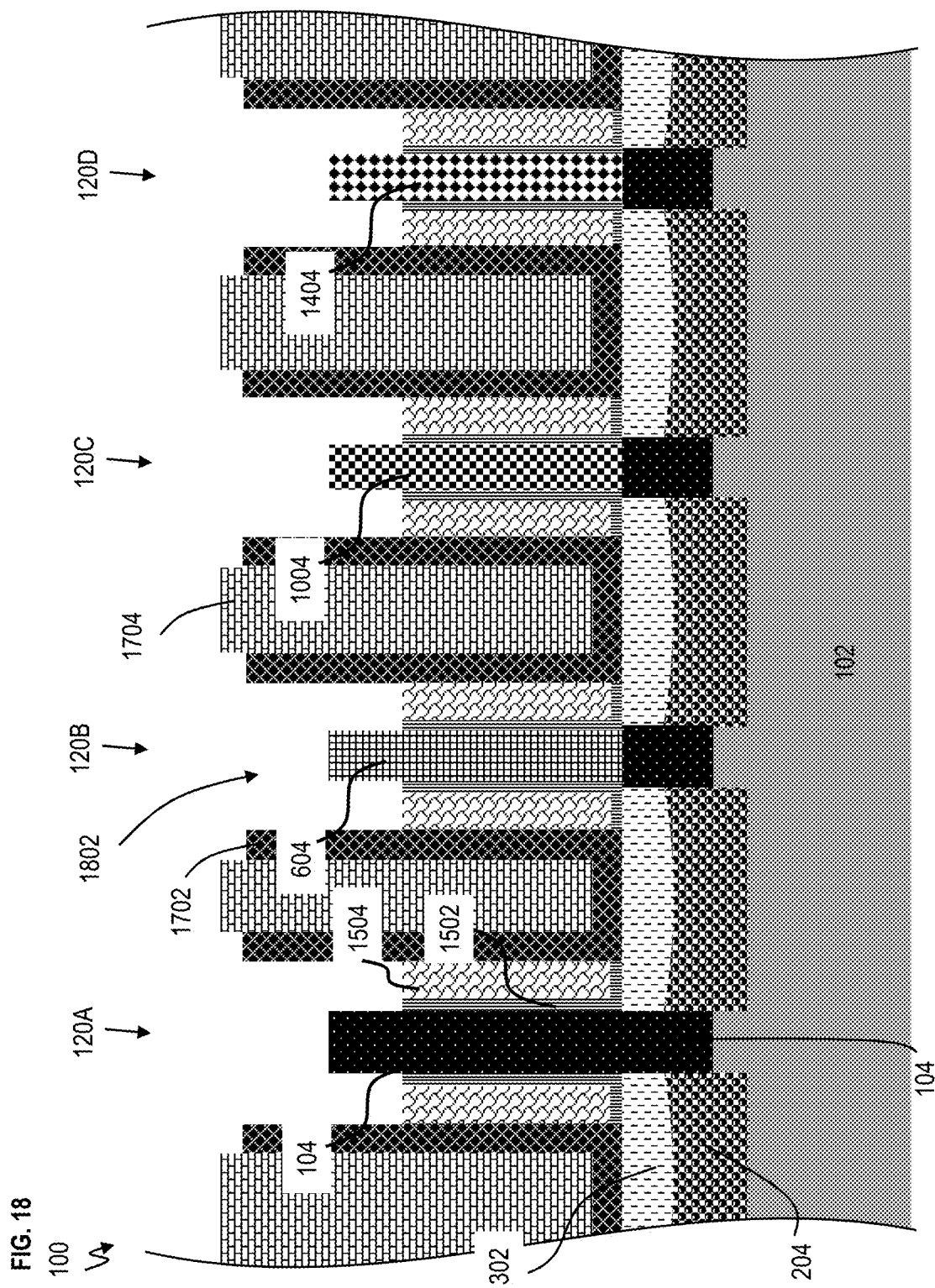

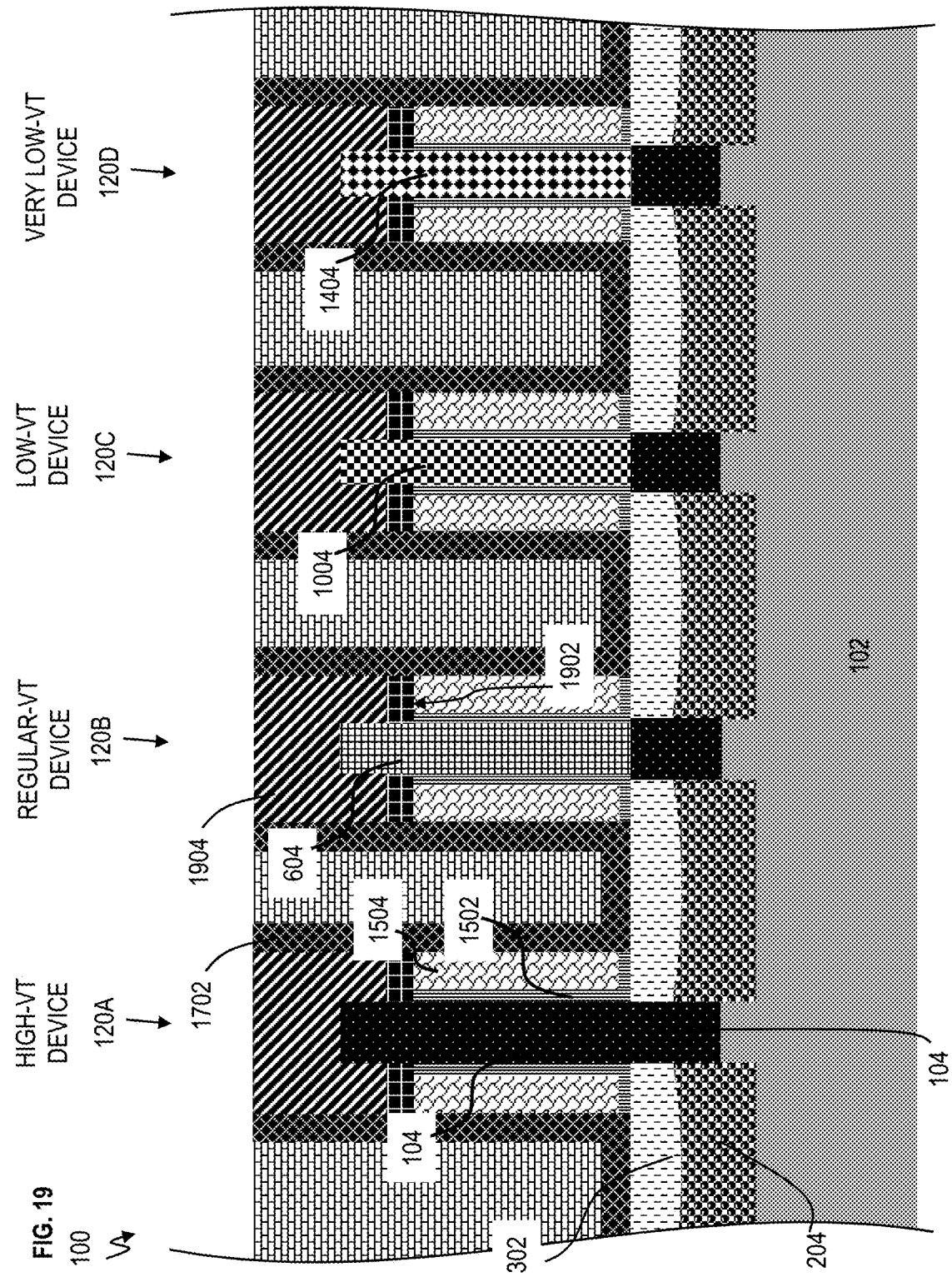

VERTICAL TRANSPORT FET HAVING MULTIPLE THRESHOLD VOLTAGES WITH ZERO-THICKNESS VARIATION OF WORK FUNCTION METAL

BACKGROUND

The present invention generally relates to fabrication methods and resulting structures for semiconductor devices, and more specifically, to vertical transport FET having multiple threshold voltages with zero-thickness variation of work function metal.

A metal-oxide-semiconductor field-effect transistors (MOSFET) is used for amplifying or switching electronic signals. The MOSFET has a source, a drain, and a metal oxide gate electrode. The metal gate portion of the metal oxide gate electrode is electrically insulated from the main semiconductor n-channel or p-channel by a thin layer of insulating material, for example, silicon dioxide or glass, which makes the input resistance of the MOSFET relatively high. The gate voltage controls whether the current path from the source to the drain is an open circuit ("off") or a resistive path ("on"). N-type field effect transistors (NFET) and p-type field effect transistors (PFET) are two types of complementary MOSFETs. The NFET includes n-doped source and drain junctions and uses electrons as the current carriers. The PFET includes p-doped source and drain junctions and uses holes as the current carriers. Complementary metal oxide semiconductor (CMOS) is a technology that uses complementary and symmetrical pairs of p-type and n-type MOSFETs to implement logic functions. A vertical transport field effect transistor or vertical field effect transistor (VFET) has a vertical orientation for transporting current carriers. Particularly, a VFET has a vertical fin-shaped channel coupling a top source/drain (S/D) region and a bottom S/D region.

SUMMARY

Embodiments of the invention are directed to a method for forming a semiconductor device. A non-limiting example of the method includes forming fins of varying concentrations of germanium and forming gate material on the fins. Source or drain (S/D) regions are adjacent to the fins, and transistor devices include the fins.

Embodiments of the invention are directed to a semiconductor device. A non-limiting example of the semiconductor device includes fins having varying concentrations of germanium and gate material formed on the fins. Source or drain (S/D) regions are adjacent to the fins, and transistor devices comprise the fins.

Embodiments of the invention are directed to a method for forming a semiconductor device. A non-limiting example of the method includes forming fins with a first concentration of germanium, increasing the germanium in at least one of the fins to a second concentration, increasing the germanium in at least another one of the fins to a third concentration, and forming gate material on the fins. Transistor devices include the fins. The transistor devices include different threshold voltages defined by the first, second, and third concentrations of the germanium.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 18 depicts a cross-sectional view of the semiconductor structure after fabrication operations according to embodiments of the invention; and FIG. 19 depicts a cross-sectional view of the semiconductor structure after fabrication operations according to embodiments of the invention.

Figure 1:
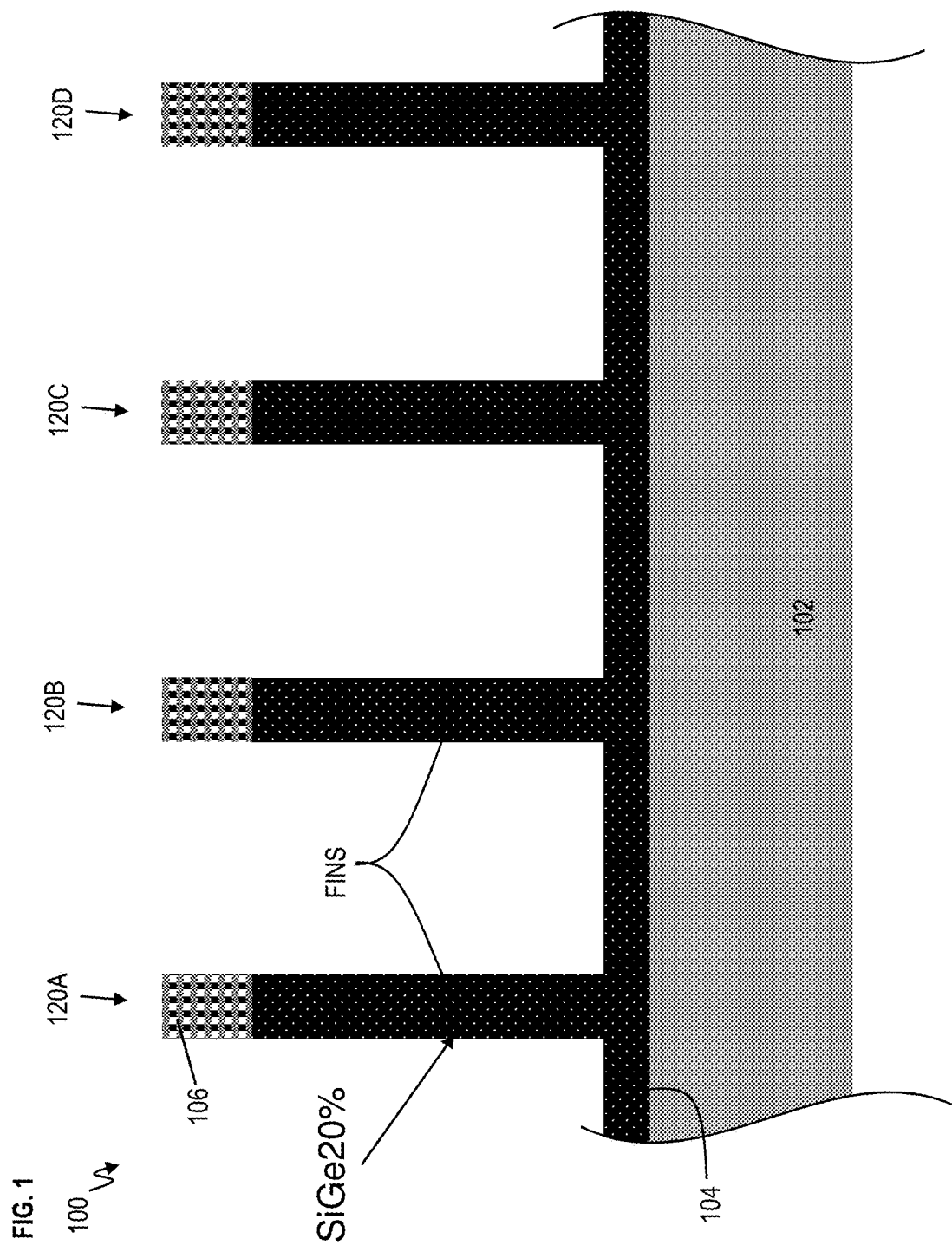
FIG. 1 depicts a cross-sectional view of an initial semiconductor structure after fabrication operations according to embodiments of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the embodiments of the invention, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, a strategy to offer multiple threshold voltage devices on silicon germanium (SiGe) channel vertical transport FETs (VFET) is based on a combination of dipole ($La_2O_3$ or $Al_2O_3$) engineering and high-k and work function metal (WFM) thickness adjustment. However, the state-of-the-art requires many WFM patterning, etch, and deposition steps, causing process complexity due to the patterning accuracy issue, gate stack damage during the multiple etch and deposition processes, and effective channel length variation due to the different WFM thicknesses.

Turning now to an overview of the aspects of the invention, one or more embodiments of the invention provide semiconductor devices and a method of forming the semiconductor devices. Embodiments of the invention provide methods to form, for example, SiGe channel vertical FETs having multiple threshold voltages. The SiGe channel vertical FETs have the same physical gate length and same high-k/metal gate stack. Also, the vertical FETs reduce process complexity because WFM patterning is not required for the purpose of multiple threshold voltage, thereby providing embodiments of the invention with a zero-thickness variation of WFM along with a multiple threshold voltage solution. The multiple threshold voltages in the vertical FETs utilize selective Ge condensation on the vertical FET structure by using, for example, a germanium oxide ($GeO_2$) layer deposited on fins of the vertical FET structure. The germanium oxide layer is condensed on the respective fins (i.e., SiGe channels) by annealing, thereby increasing the germanium concentration in the respective fins and shifting the threshold voltage of the vertical FETs according to the thickness of the germanium oxide layer providing the germanium. The fins having a germanium concentration based on the thickness of the germanium oxide layer can have a first $GeO_2$ thickness, a second $GeO_2$ thickness, and a third $GeO_2$ thickness, where the third $GeO_2$ thickness is greater than (>) the second $GeO_2$ thickness which is greater than (>) the first $GeO_2$ thickness. The annealing can be performed in an inert gas ambient, such as, for example, $N_2$, Ar, He, and/or any combination of gases, and the annealing can be at temperature ranges from about 500° C. to 700° C. The multiple threshold voltage vertical FETs all have common gate stacks (IL/high-k/WFM), which allows all vertical FET devices to be fabricated with the same gate stack while having different threshold voltages because of their difference in Ge concentration in their respective SiGe channel.

Turning now to a more detailed description of aspects of the present invention, FIG. 1 depicts a cross-sectional view of the semiconductor device 100 according to embodiments of the invention. The semiconductor device 100 includes a substrate 102 with a channel layer 104 formed on top of the substrate 102. A hardmask layer 106 is formed on top of the channel layer 104 in preparation to form fins in the channel layer 104. The hardmask layer 106 can be a nitride based material such as silicon nitride (SiN), an oxide based material such as silicon oxide ($SiO_2$), etc. The hardmask layer 106 is patterned using a wet or dry etch. Fin reactive ion etching (RIE) is performed to form fins in the channel layer 104 with a target height. Four fins are depicted and each of the fins has the same height.

The substrate 102 can be silicon or another semiconductor material. The channel layer 104 can be epitaxially grown from the substrate 102. The channel layer 104 can be silicon germanium (SiGe). The germanium (Ge) concentration in the channel layer 104 of $SiGe_x$ can have an atomic percent of about 20%, where x is about 20%. The height of the channel layer 104 can range from about 30 nm to 70 nm. Accordingly, the height of each vertical fin can range from about 30 nm to 70 nm. The semiconductor device 100 is a multiple threshold voltage device with four vertical fins, where each fin is to be formed as a different VFET device 120A, 120B, 120C, and 120D each with different threshold voltages in this example. Each VFET device can be representative of numerous transistors.

Figure 2:
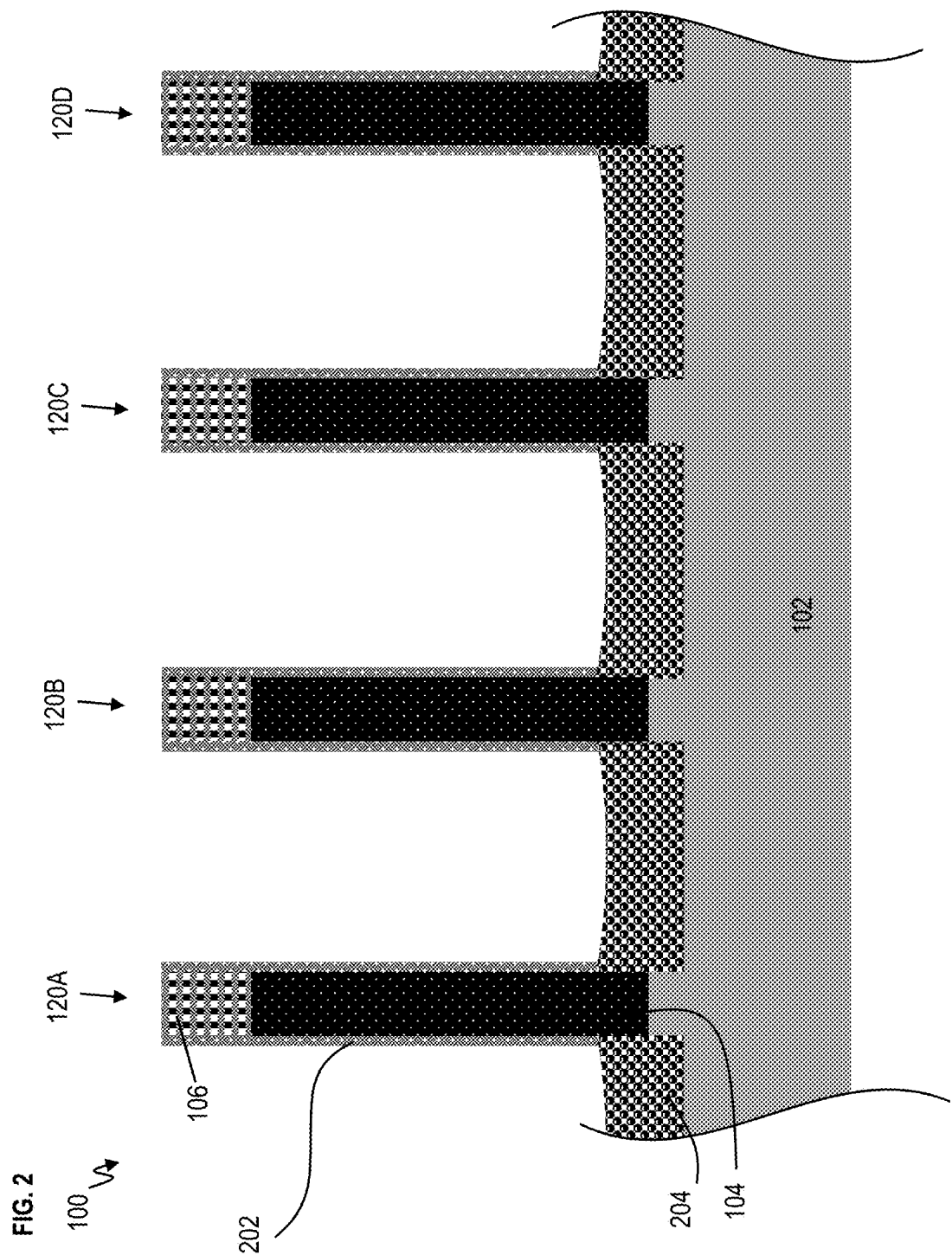
FIG. 2 depicts a cross-sectional view of the semiconductor structure after fabrication operations according to embodiments of the invention.

FIG. 2 depicts a cross-sectional view of the semiconductor device 100 according to embodiments of the invention. Bottom source and drain formation is performed. Spacers 202 are formed on the sidewalls of the fins of the channel layers 104 for devices 120A, 120B, 120C, and 120D. The spacers 202 can be a nitride based material such as silicon nitride (SiN), an oxide based material such as silicon oxide ($SiO_2$), etc. The spacers 202 can be formed by directional (non-conformal) or conformal deposition, and the material of the spacers 202 is etched back such that the spacers 202 remain on the fin sidewalls.

A bottom portion of the channel layer 104 formed on the substrate is recessed in preparation for source/drain formation. After recessing the bottom portion of the channel layer 104, epitaxial growth of the bottom source/drain (S/D) regions 204 is performed. The bottom S/D layer 204 can be SiGe doped with boron (B) represented as SiGe:B. The height of the bottom S/D layer 204 can be about 10 nm to 40 nm. The bottom S/D regions 204 are adjacent to the sides of the fins such that current can flow from the bottom S/D regions 204 into the fins during operation or current can flow out from the fins into bottom the S/D regions 204.

Figure 3:
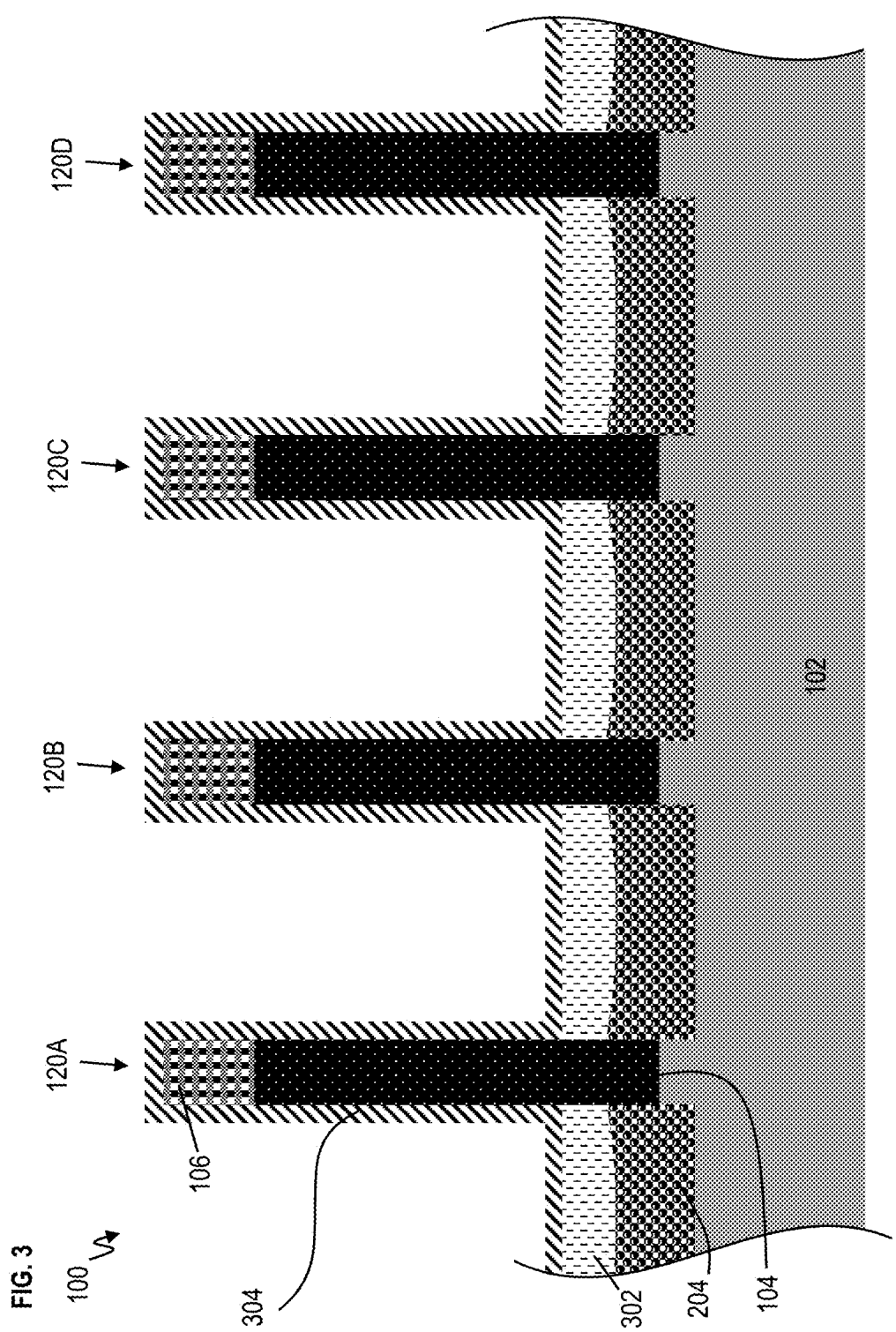
FIG. 3 depicts a cross-sectional view of the semiconductor structure after fabrication operations according to embodiments of the invention.

FIG. 3 depicts a cross-sectional view of the semiconductor device 100 according to embodiments of the invention. Bottom spacer formation is performed. For example, the fin sidewall spacers 202 are stripped, using a wet or dry etch. Bottom spacer directional deposition is performed to deposit a bottom spacer 302. The directional deposition can be a non-conformal deposition, such as high density plasma deposition (HDPD), physical vapor deposition (PVD), etc. The bottom spacer 302 can be a low-k dielectric material. The bottom spacer 302 can be, for example, silicon carbon boron (SiCB), silicon carbon boron nitride (SiCBN), etc. Etch back, using a wet or dry etch, is performed to recess the bottom spacer 302.

Fin liner deposition is performed to deposit a fin liner 304. The fin liner 304 can be conformally deposited to cover the fins of channel layer 104 along with the bottom spacer 302. The thickness of the fin liner 304 can be about 2 nm to 3 nm. The fin liner 304 can be an oxide based material, such as, silicon dioxide ($SiO_2$). The fin liner 304 should be selective to the material of the bottom spacer 302 for further operations.

Figure 4:
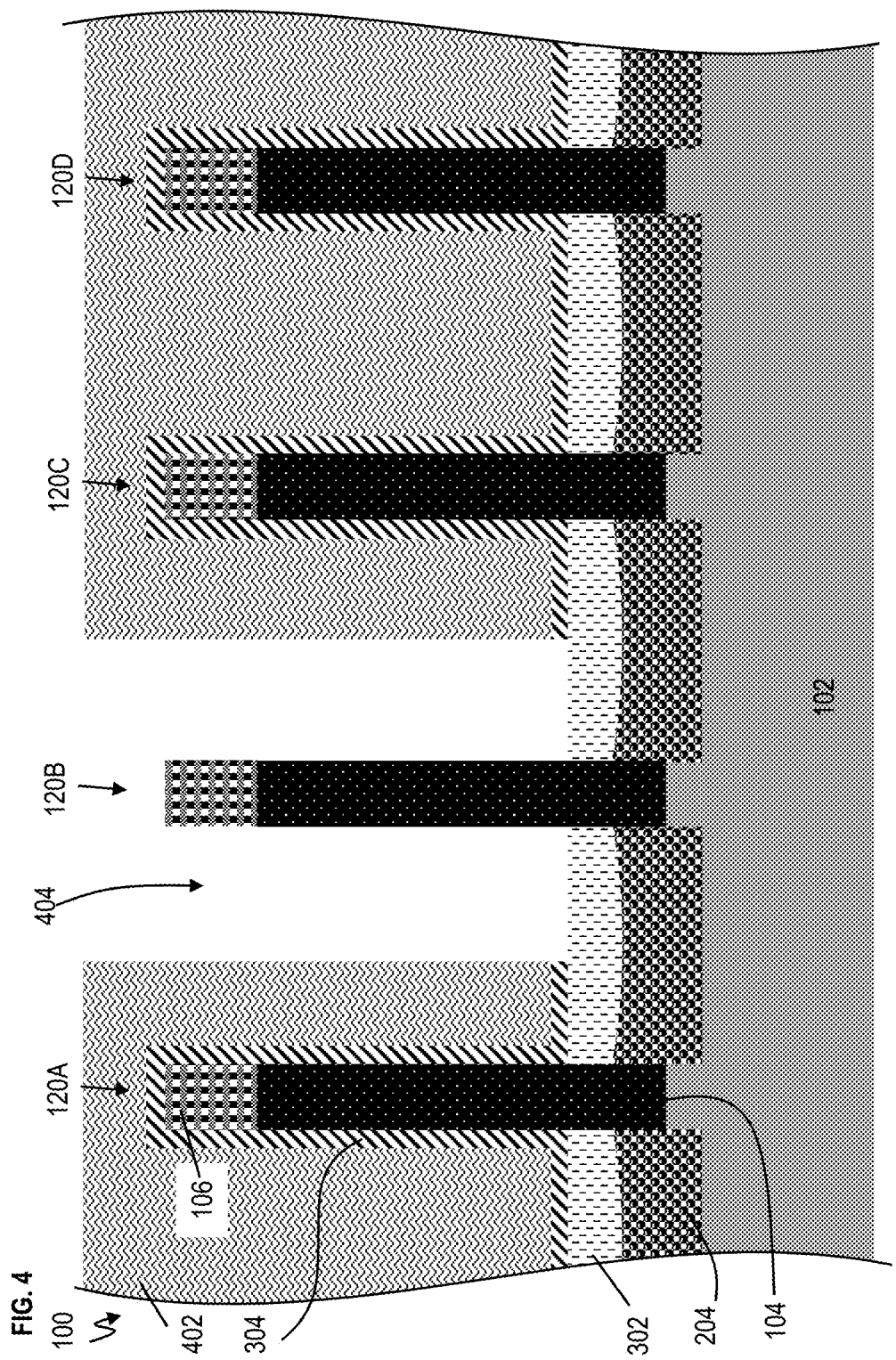
FIG. 4 depicts a cross-sectional view of the semiconductor structure after fabrication operations according to embodiments of the invention.

FIG. 4 depicts a cross-sectional view of the semiconductor device 100 according to embodiments of the invention. Fin liner removal with patterning is performed. For example, a block mask 402 is deposited. The block mask 402 can be an organic planarization layer (OPL), an organic dielectric layer (ODL), etc. Lithography is performed to pattern an opening 404 over a selective area, such that the fin for VFET device 120B is exposed. The exposed portion of the fin liner 304 is removed. The exposed portion of the fin liner 304 can be removed by a wet etch using, for example, hydrofluoric acid (HF) or dilute hydrofluoric acid (DHF). The opening 404 is in preparation for germanium dioxide ($GeO_2$) deposition on the fin of VFET device 120B.

Figure 5:
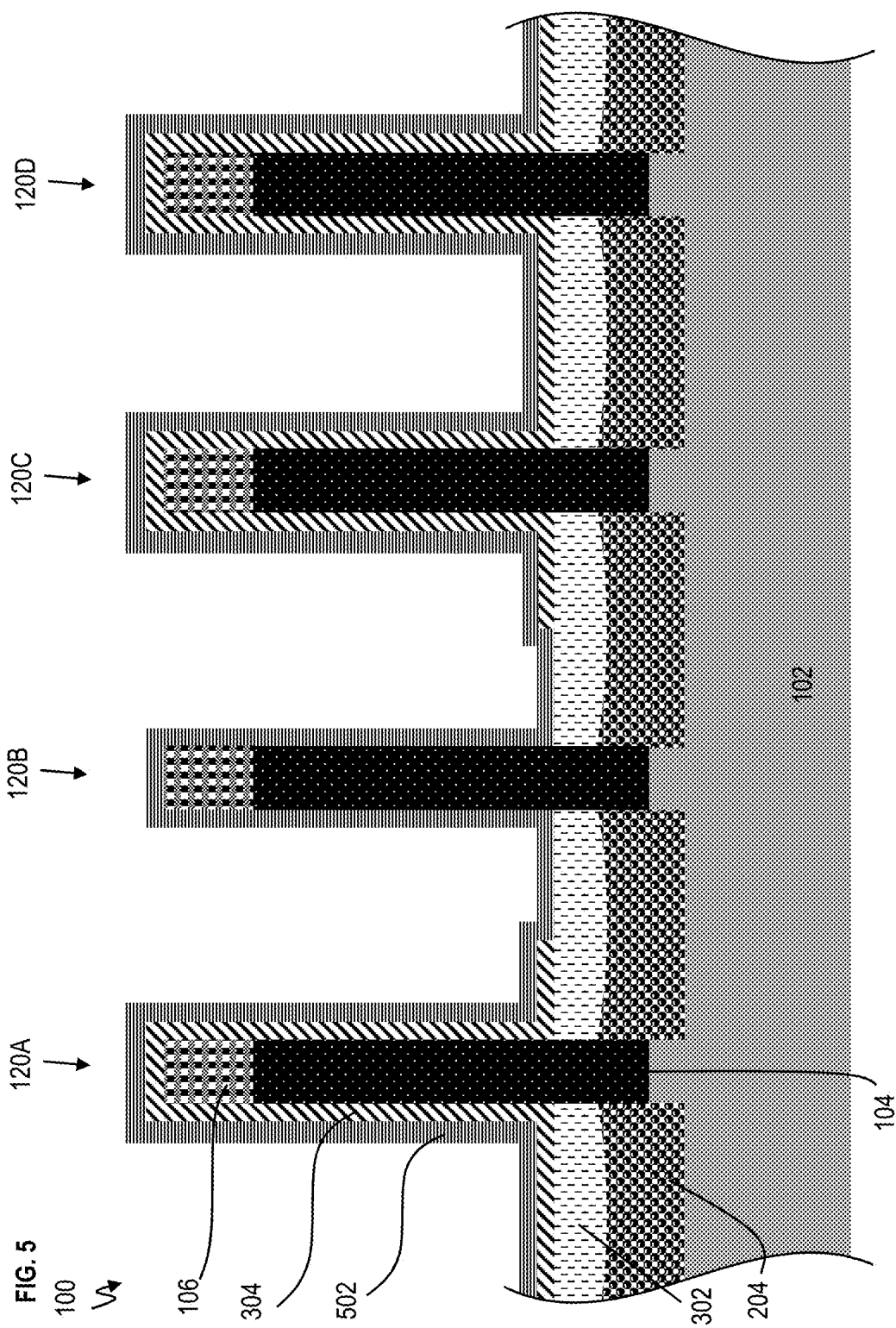
FIG. 5 depicts a cross-sectional view of the semiconductor structure after fabrication operations according to embodiments of the invention.

FIG. 5 depicts a cross-sectional view of the semiconductor device 100 according to embodiments of the invention. Germanium oxide deposition is performed. For example, the block mask 402 is removed. The block mask 402 can be removed using, for example, plasma etch. After the block mask 402 is removed, conformal deposition of a reaction layer 502 is performed. The reaction layer 502 can be deposited using any conformal deposition process, such as atomic layer deposition (ALD), etc. The thickness of the reaction layer 502 is controlled to have a predefined thickness required for a predefined threshold voltage as discussed further herein. The thickness of the reaction layer 502 can be about 3 nm to 4 nm. The reaction layer 502 is germanium oxide ($GeO_2$). Another example of the reaction layer 502 can be a mixture of germanium oxide ($GeO_2$) and silicon oxide ($SiO_2$), although $GeO_2$ might be more effective and is discussed for illustration purposes.

In VFET device 120B, the exposed SiGe fin is directly contacting the ($GeO_2$) reaction layer 502. The other SiGe fins in devices 120A, 120C, 120D are still covered by fin liner 304 such that the reaction layer 502 covers the fin liner 304 but does not directly contact the SiGe fins. Particularly, the material of channel layer 104 is directly covered by the reaction layer 502 in device 120B, while the material of channel layer 104 is protected in devices 120A, 120C, 120D. At this point, the fins in devices 120A, 120B, 120C, and 120D have the same or about the same concentration of Ge, for example, $SiGe_{20\%}$, which results in the same or about the same threshold voltage for now.

Figure 6:
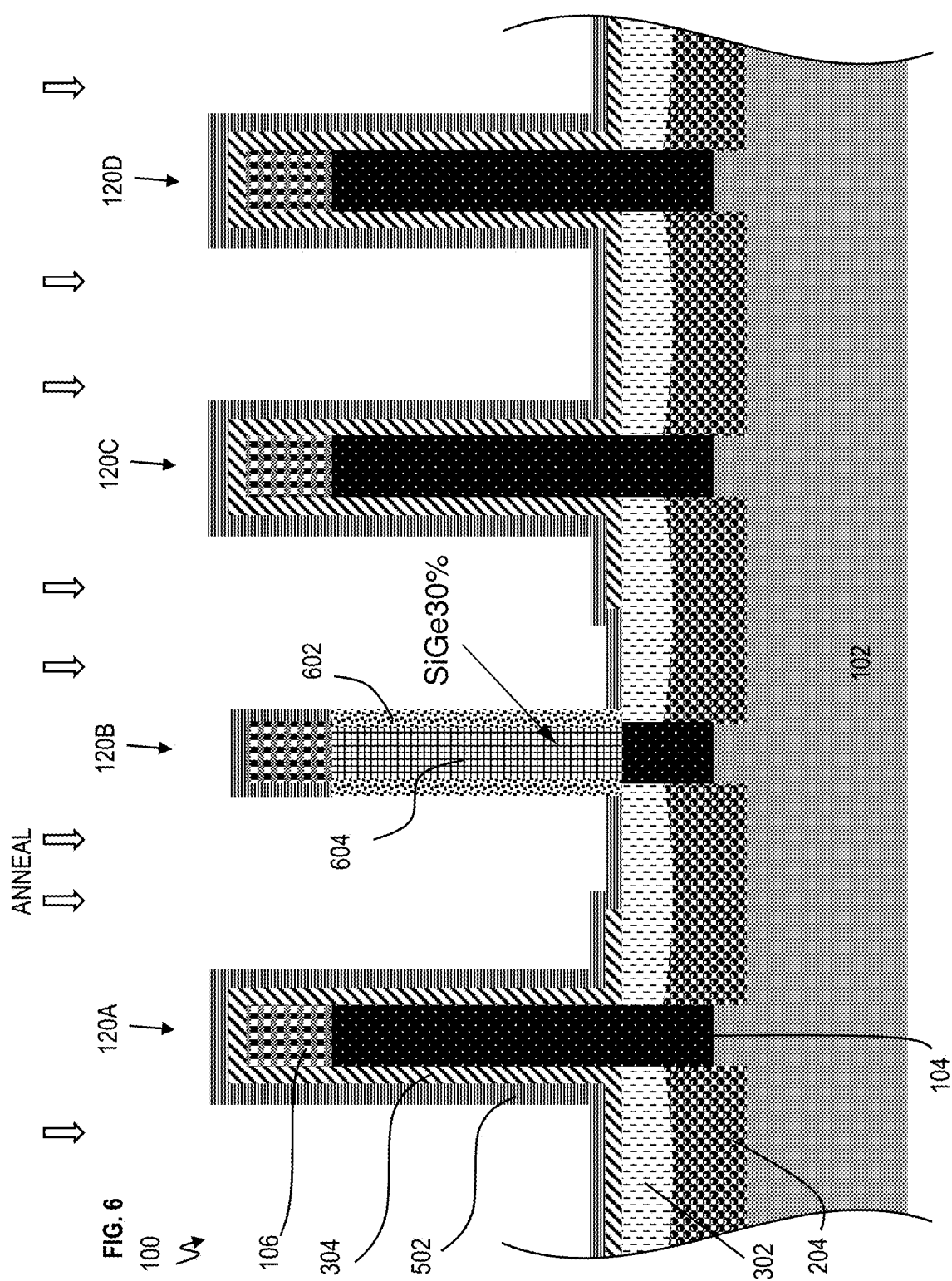
FIG. 6 depicts a cross-sectional view of the semiconductor structure after fabrication operations according to embodiments of the invention.

FIG. 6 depicts a cross-sectional view of the semiconductor device 100 according to embodiments of the invention. The first selective Ge condensation is performed for transistor device 120B. For example, annealing is performed to cause the first selective Ge condensation which changes (i.e., increases) the Ge concentration in the exposed SiGe fin of device 120B. After the chemical reaction of the SiGe and $GeO_2$ interface, the Ge is condensed and $GeO_2$ converts to $SiO_2$. In particular, a chemical reaction occurs between the exposed fin of the SiGe channel layer 104 and the $GeO_2$ reaction layer 502 in device 120B, which converts the reaction layer 502 into converted layer 602 and converts channel layer 104 into modified channel layer 604. Accordingly, the fin in device 120B now contains the modified channel layer 604 which has been formed to have a higher concentration of germanium than the previous channel layer 104 (i.e., prior to condensation). In this example, the modified channel layer 604 can be $SiGe_y$, where the atomic percent of y is about 30%, i.e., $SiGe_{30\%}$ in this example illustration. The converted layer 602, which was previously $GeO_2$ reaction layer 502, is now on the modified channel layer 604 and the converted layer 602 is $SiO_2$.

The Ge condensation causes the Ge concentration in the modified channel layer 604 to be increased in device 120B. The chemical reaction is described in the table below:

| Si | + | Ge | + | $2GeO_2$ | → | Ge | + | 2GeO | + | $SiO_2$ |
|---|---|---|---|---|---|---|---|---|---|---|
| | | | | | | Remained | | Volatile Species | | Oxide formation |

The Ge condensation only causes a chemical reaction where the SiGe channel layer 104 directly interfaces (i.e., physically contacts) the $GeO_2$ reaction layer 502, thereby converting the channel layer 104 into modified channel layer 604. This chemical reaction occurs in an inert gas ambient for temperatures ranges from about 500° C. to about 700° C. The materials of the inert gas can include, for example, $N_2$, Ar, He, and/or any other mixture of these gases.

As can be seen in FIG. 6, the top portion of the reaction layer 502 on the fin does not chemically react with the hardmask layer 106 of device 120B and thus the top portion of the device 120B remains unreacted. Similarly, the reaction layer 502 on the fins in devices 120A, 120C, and 120D is unreacted. As discussed herein, the threshold voltage (Vt) can be controlled by Ge concentration in the SiGe channel. Accordingly, the device 120B has a modified threshold voltage as discussed herein. The increase in germanium in the fin of the transistor device causes a decrease in the threshold voltage of the transistor device 120B. For example, a germanium oxide thickness of about 1 nm to 2 nm (which is condensed (i.e., Ge is diffused into the underlying fin during anneal) as discussed herein) causes about a 30 to 100 millivolt (mv) decrease in the threshold voltage of a transistor without requiring a change in the thickness of the high-k dielectric layer and/or work function metal. Further processing will continue for devices 120C and 120D to modify their respective channel layers 104.

Figure 7:
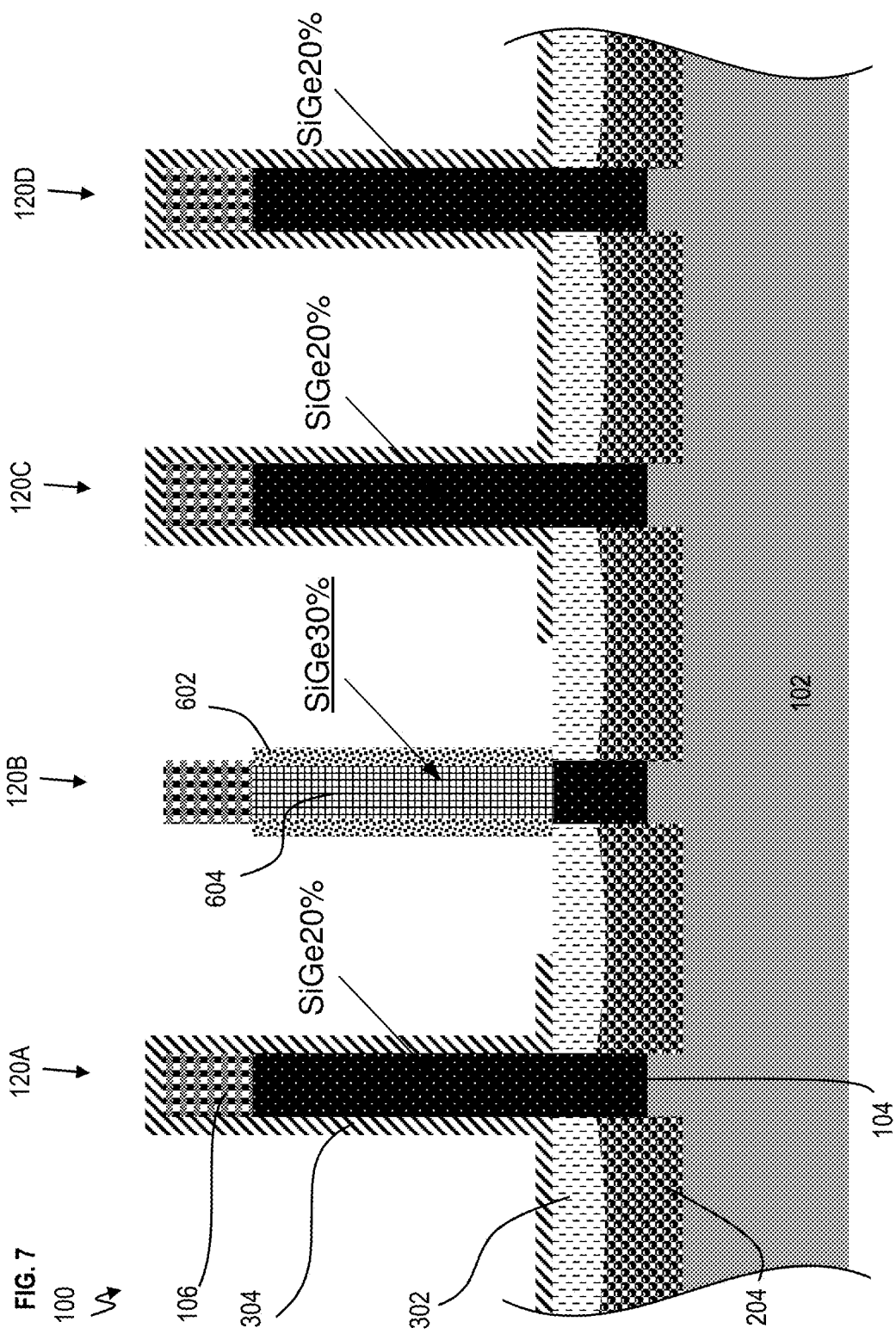
FIG. 7 depicts a cross-sectional view of the semiconductor structure after fabrication operations according to embodiments of the invention.

FIG. 7 depicts a cross-sectional view of the semiconductor device 100 according to embodiments of the invention. The unreacted reaction layer 502 on the fin liner 304, the hardmask layer 106 of transistor device 120B, and the bottom spacer 302 is removed. The reaction layer 502 can be removed by a water wash. The water wash can be a deionized water wash. FIG. 7 also depicts that devices 120A, 120C, and 120D each have fins of the channel layer 104 containing, for example, $SiGe_{20\%}$, while the device 120B has a fin with modified channel layer 604 containing, for example, $SiGe_{30\%}$.

Figure 8:
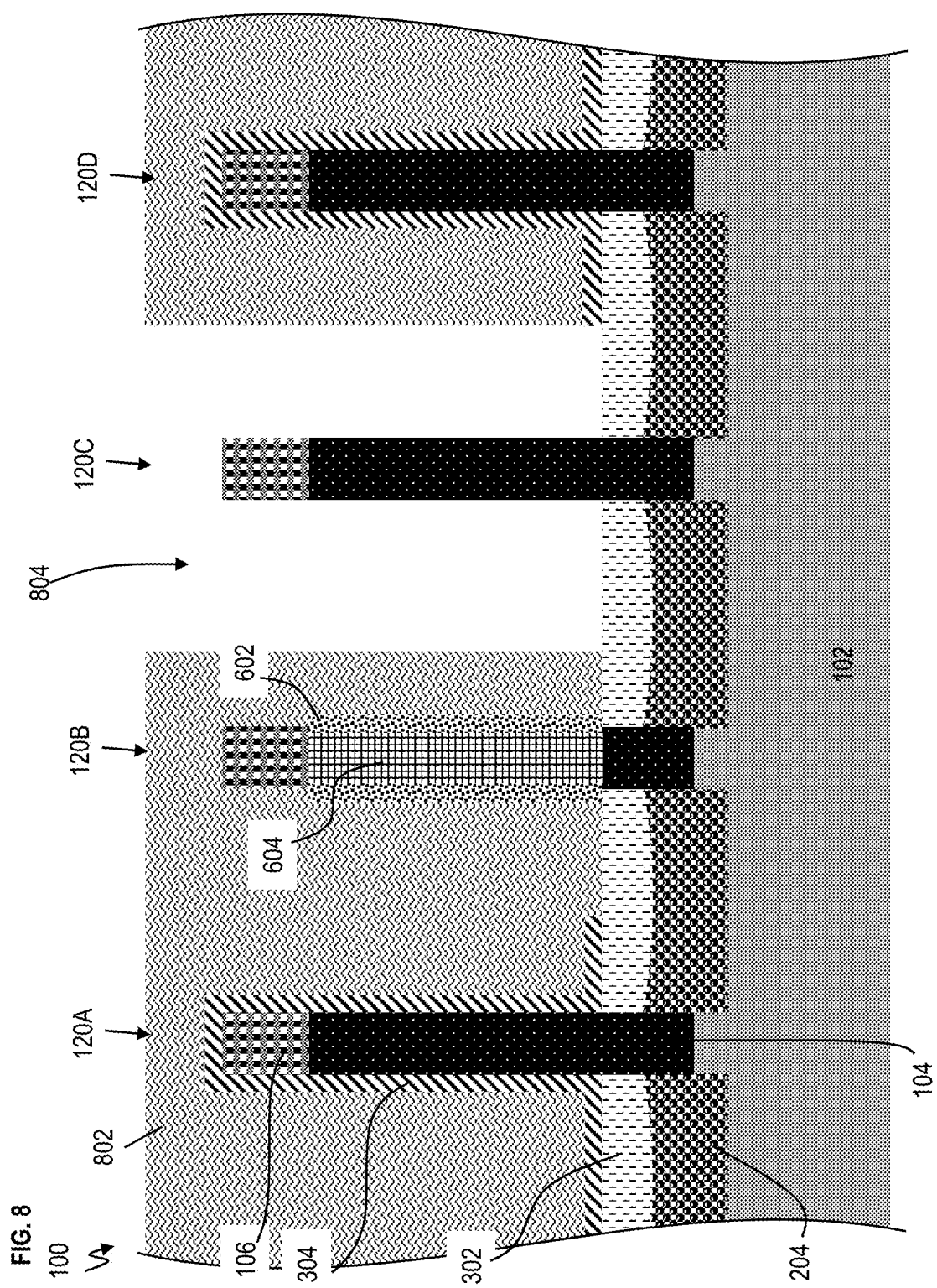
FIG. 8 depicts a cross-sectional view of the semiconductor structure after fabrication operations according to embodiments of the invention.

FIG. 8 depicts a cross-sectional view of the semiconductor device 100 according to embodiments of the invention. Analogous to FIG. 4, fin liner removal with block mask patterning is performed for transistor device 120C. For example, a block mask 802 is deposited. The block mask 802 can be an organic planarization layer (OPL), an organic dielectric layer (ODL), etc. Lithography is performed to pattern an opening 804 over a selective area, such that the fin for VFET device 120C is exposed. The exposed portion of the fin liner 304 is removed from the VFET device 120C. The exposed portion of the fin liner 304 can be removed by a wet etch using, for example, hydrofluoric acid (HF) or dilute hydrofluoric acid (DHF). The opening 804 is in preparation for germanium dioxide ($GeO_2$) deposition directly on the fin of VFET device 120C. This is in preparation for Ge condensation on the VFET device 120C.

Figure 9:
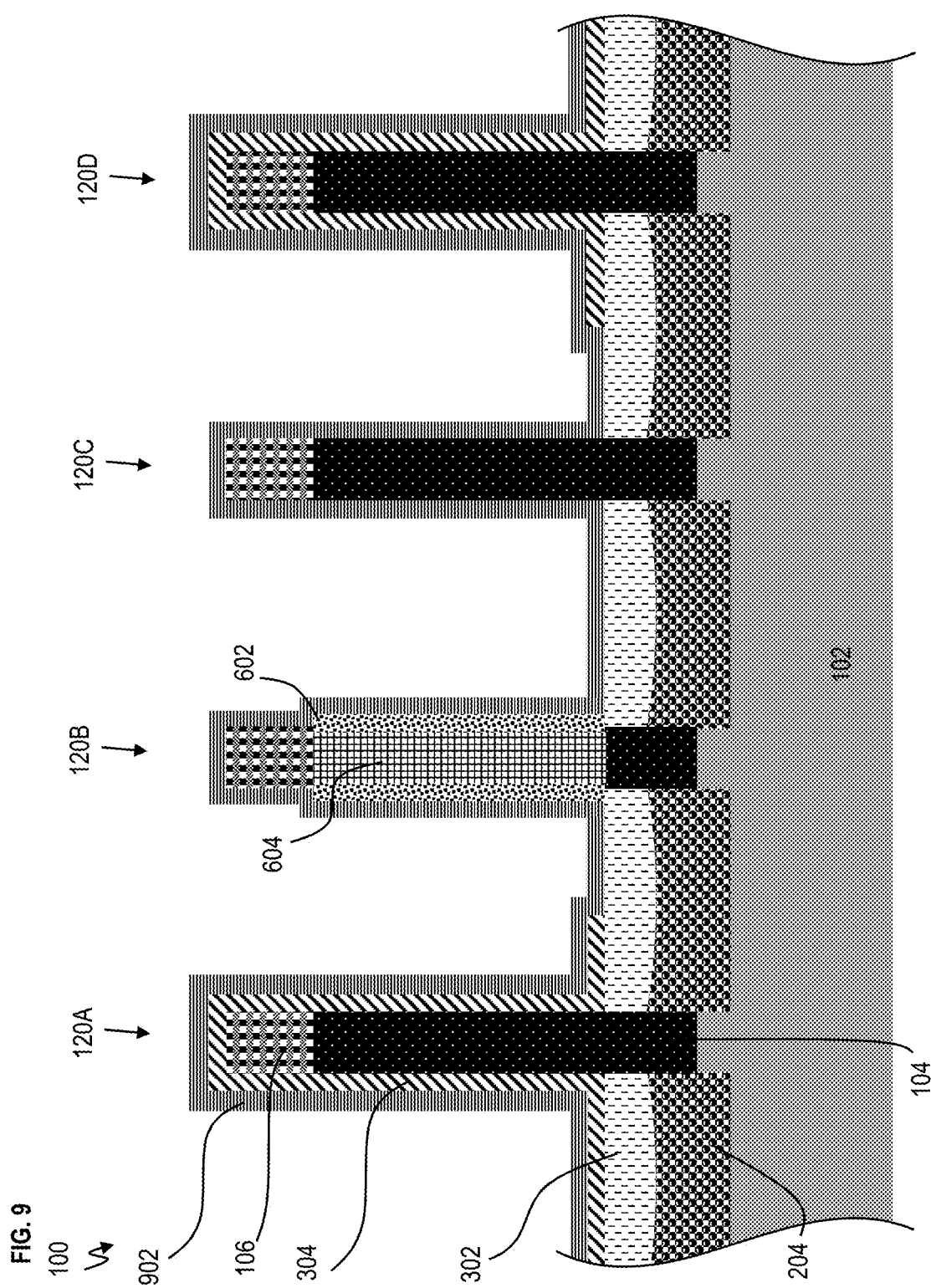
FIG. 9 depicts a cross-sectional view of the semiconductor structure after fabrication operations according to embodiments of the invention.

FIG. 9 depicts a cross-sectional view of the semiconductor device 100 according to embodiments of the invention. Analogous to FIG. 5, germanium oxide deposition is performed. For example, the block mask 802 is removed. The block mask 802 can be removed using, for example, plasma etch. After the block mask 802 is removed, conformal deposition of a reaction layer 902 is performed. The reaction layer 902 can be deposited using any conformal deposition process, such as atomic layer deposition (ALD). The thickness of the reaction layer 902 can be about 5 to 6 nm. The reaction layer 902 is germanium oxide ($GeO_2$). As noted above, another example of the reaction layer 902 can be a mixture of germanium oxide ($GeO_2$) and silicon oxide ($SiO_2$), although $GeO_2$ might be more effective. The reaction layer 902 in FIG. 9 is analogous to the reaction layer 502 in FIG. 5. However, it is noted that the $GeO_2$ thickness (e.g., 5-6 nm) of the reaction layer 902 is thicker than first $GeO_2$ deposition (3-4 nm) of reaction layer 502 in FIG. 5, thereby providing more chemical reactions of SiGe and $GeO_2$. As such, the concentration of Ge is greater in device 120C as depicted in FIG. 10.

Referring to FIG. 9, in device 120C, the exposed SiGe fin is directly contacting the ($GeO_2$) reaction layer 902. The other SiGe fins of channel layer 104 in devices 120A and 120D are still covered by fin liner 304 such that the reaction layer 902 covers their fin liner 304, while the fin of channel layer 604 of device 120B is covered by converted layer 602 such that the reaction layer 902 covers the converted layer 602. In this case, the material of channel layer 104 is directly covered by the reaction layer 902 in device 120C, while the material of channel layer 104 and channel layer 604 is protected in devices 120A, 120D and device 120B, respectively.

Figure 10:
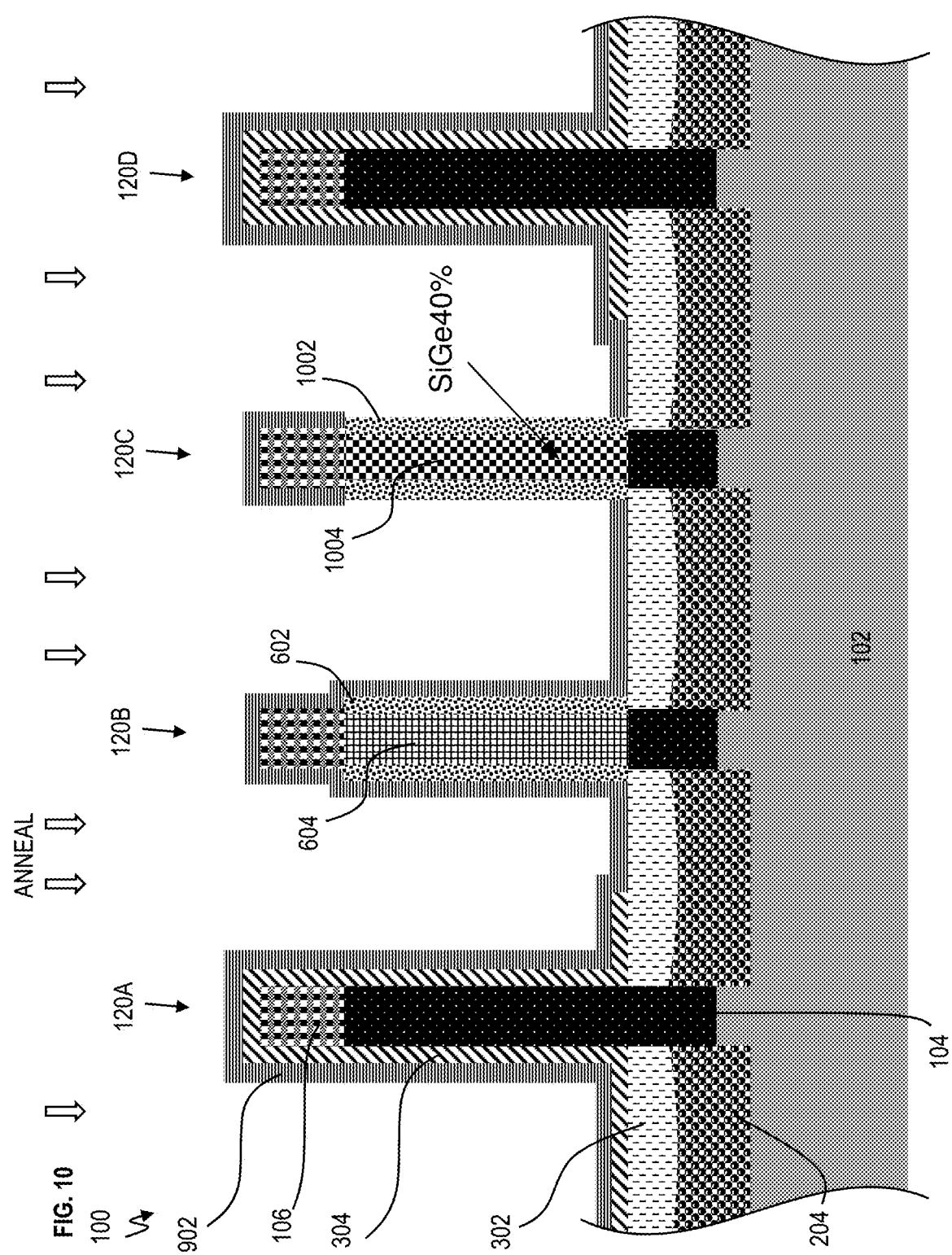
FIG. 10 depicts a cross-sectional view of the semiconductor structure after fabrication operations according to embodiments of the invention.

FIG. 10 depicts a cross-sectional view of the semiconductor device 100 according to embodiments of the invention. Analogous to FIG. 6, the second selective Ge condensation is performed. For example, annealing is performed to cause the second selective Ge condensation which changes the Ge concentration in the exposed SiGe fin of device 120C but not the other protected fins. After the chemical reaction at the SiGe and $GeO_2$ interface, the Ge is condensed and $GeO_2$ converts to $SiO_2$. In particular, a chemical reaction occurs between the exposed fin of the SiGe channel layer 104 and the $GeO_2$ reaction layer 902 in device 120C, which converts the reaction layer 902 into converted layer 1002 and converts channel layer 104 into modified channel layer 1004. Accordingly, the fin in device 120C now contains the modified channel layer 1004 which has been formed to have a higher concentration of germanium than the previous channel layer 104. In this example, the modified channel layer 1004 can be $SiGe_z$ where the atomic percent of z is about 40%, i.e., $SiGe_{40\%}$. The converted layer 1002, which was previously $GeO_2$ reaction layer 902, is on the modified channel layer 1004, and the converted layer 1002 is formed into an oxide, such as, for example, $SiO_2$.

The Ge condensation causes the Ge concentration in the modified channel layer 1004 to be increased in device 120C. The chemical reaction is described in the table discussed above. As noted above, this chemical reaction occurs in an inert gas ambient for temperatures ranges from about 500° C. to about 700° C. The materials of the inert gas can include, for example, $N_2$, Ar, He, and/or any other mixture of these gases.

As can be seen in FIG. 10, the top portion of the reaction layer 902 on the fin does not chemically react with the hardmask layer 106 of device 120C and thus the top portion of the device 120C remains unreacted. Similarly, the reaction layer 902 on the fins in devices 120A, 120B, and 120D is unreacted. As discussed herein, the threshold voltage (Vt) can be controlled by Ge concentration in the SiGe channel. Accordingly, the device 120C has a modified threshold voltage because the increase in germanium in the fin causes a decrease in the threshold voltage of the transistor device 120C. Further processing will continue for device 120D to modify its channel layer 104.

Figure 11:
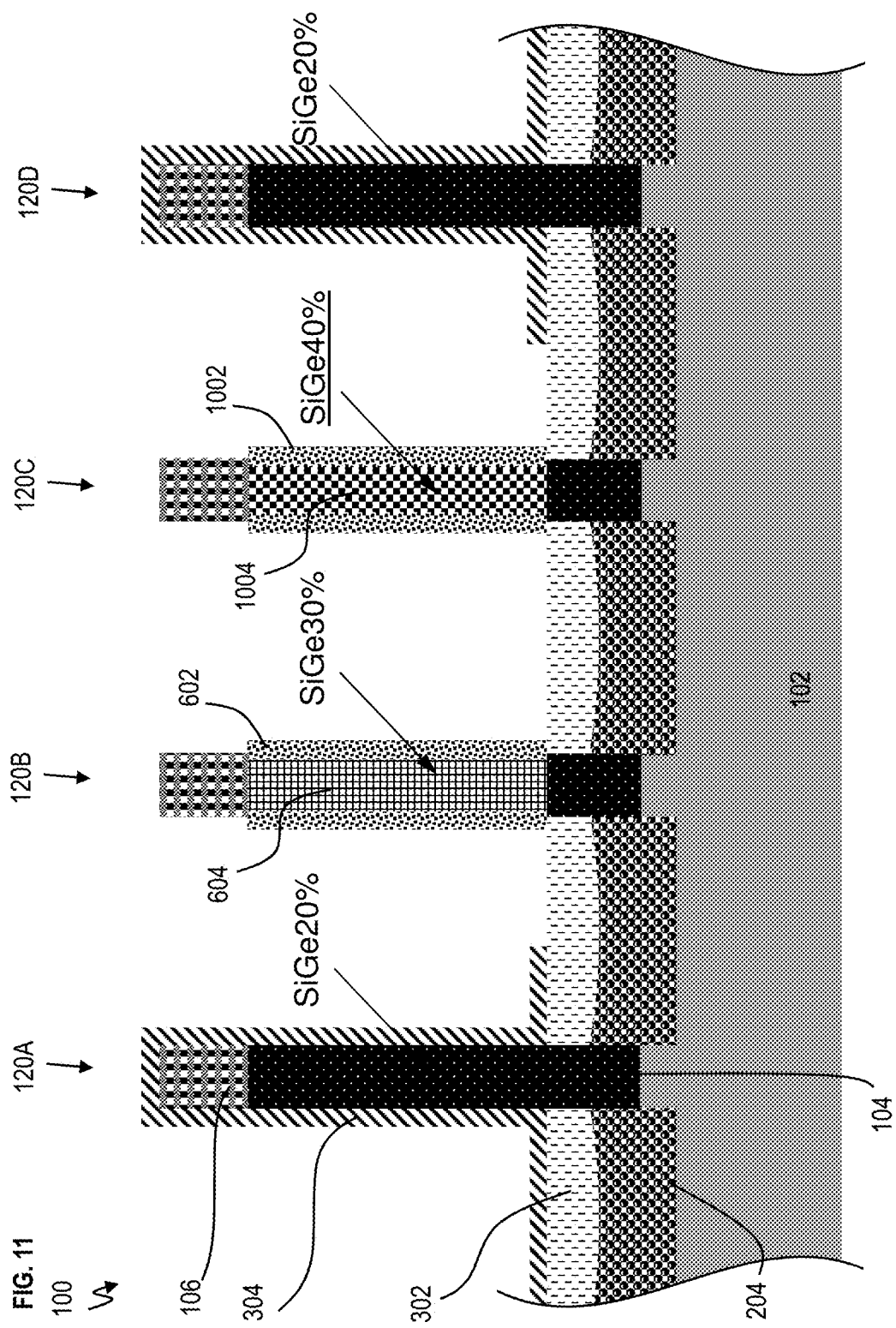
FIG. 11 depicts a cross-sectional view of the semiconductor structure after fabrication operations according to embodiments of the invention.

FIG. 11 depicts a cross-sectional view of the semiconductor device 100 according to embodiments of the invention. Analogous to FIG. 7, the unreacted reaction layer 902 on the fin liner 304, fin hardmask 106, and bottom spacer 302 is removed. As noted above, the reaction layer 902 can be removed by a water wash, such as a deionized water wash. Also, FIG. 11 depicts devices 120A and 120D each having fins of channel layer 104 containing, for example, $SiGe_{20\%}$, the device 120B having a fin with a modified channel layer 604 containing, for example, $SiGe_{30\%}$, and the device 120C having a fin with a modified channel 1004 containing, for example, $SiGe40_\%$.

Figure 12:
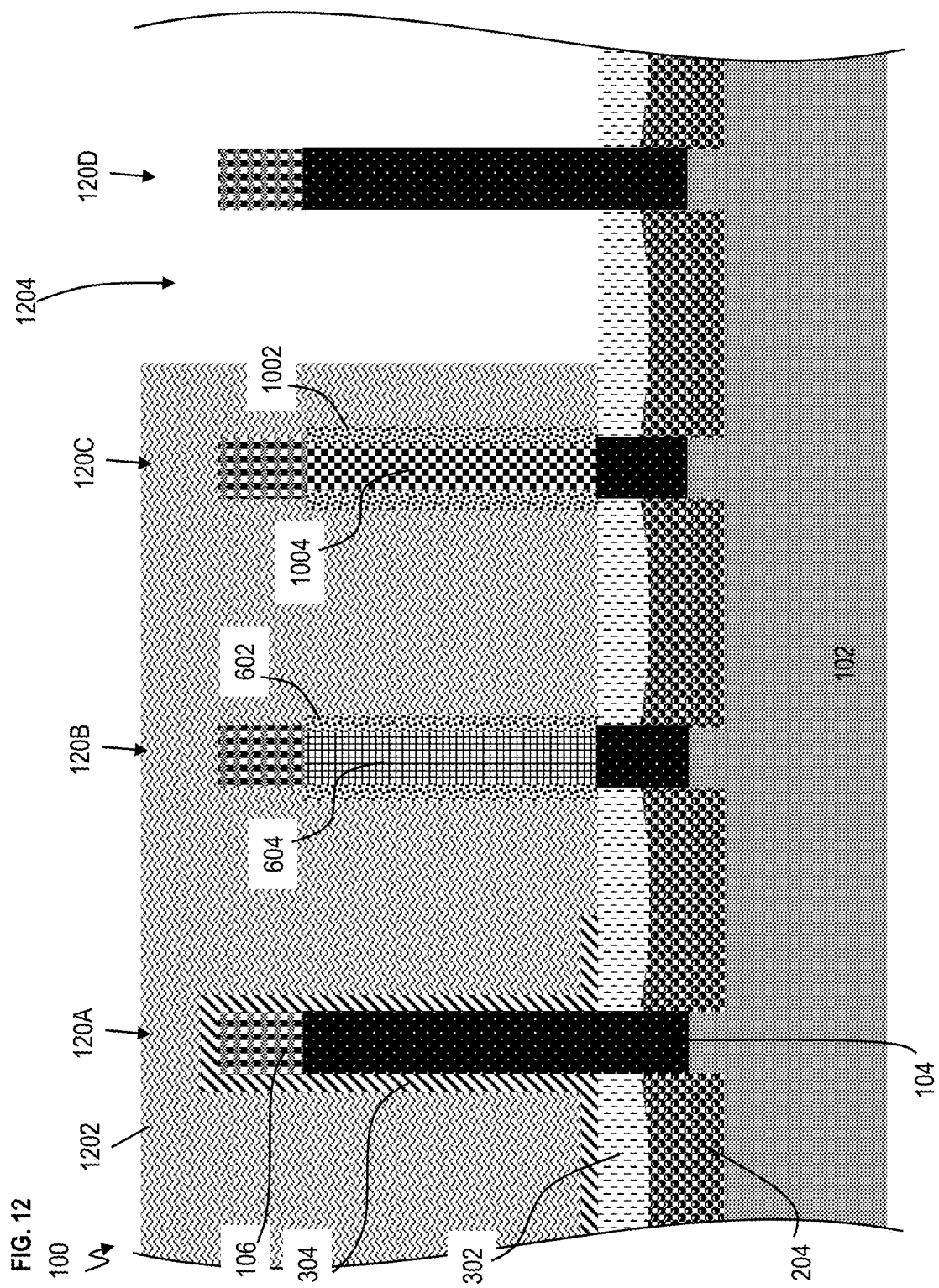
FIG. 12 depicts a cross-sectional view of the semiconductor structure after fabrication operations according to embodiments of the invention.

FIG. 12 depicts a cross-sectional view of the semiconductor device 100 according to embodiments of the invention. Analogous to FIGS. 4 and 8, fin liner removal with block mask patterning is performed. For example, a block mask 1202 is deposited. The block mask 1202 can be OPL, ODL, etc. Lithography is performed to pattern an opening 1204 over a selective area, such that the fin for VFET device 120D is exposed. The exposed portion of the fin liner 304 is removed from the VFET device 120D. The exposed portion of the fin liner 304 can be removed by a wet etch using, for example, HF or DHF. The opening 1204 is in preparation for germanium dioxide ($GeO_2$) deposition directly on of the fin of VFET device 120D to be followed by Ge condensation on the VFET device 120D.

Figure 13:
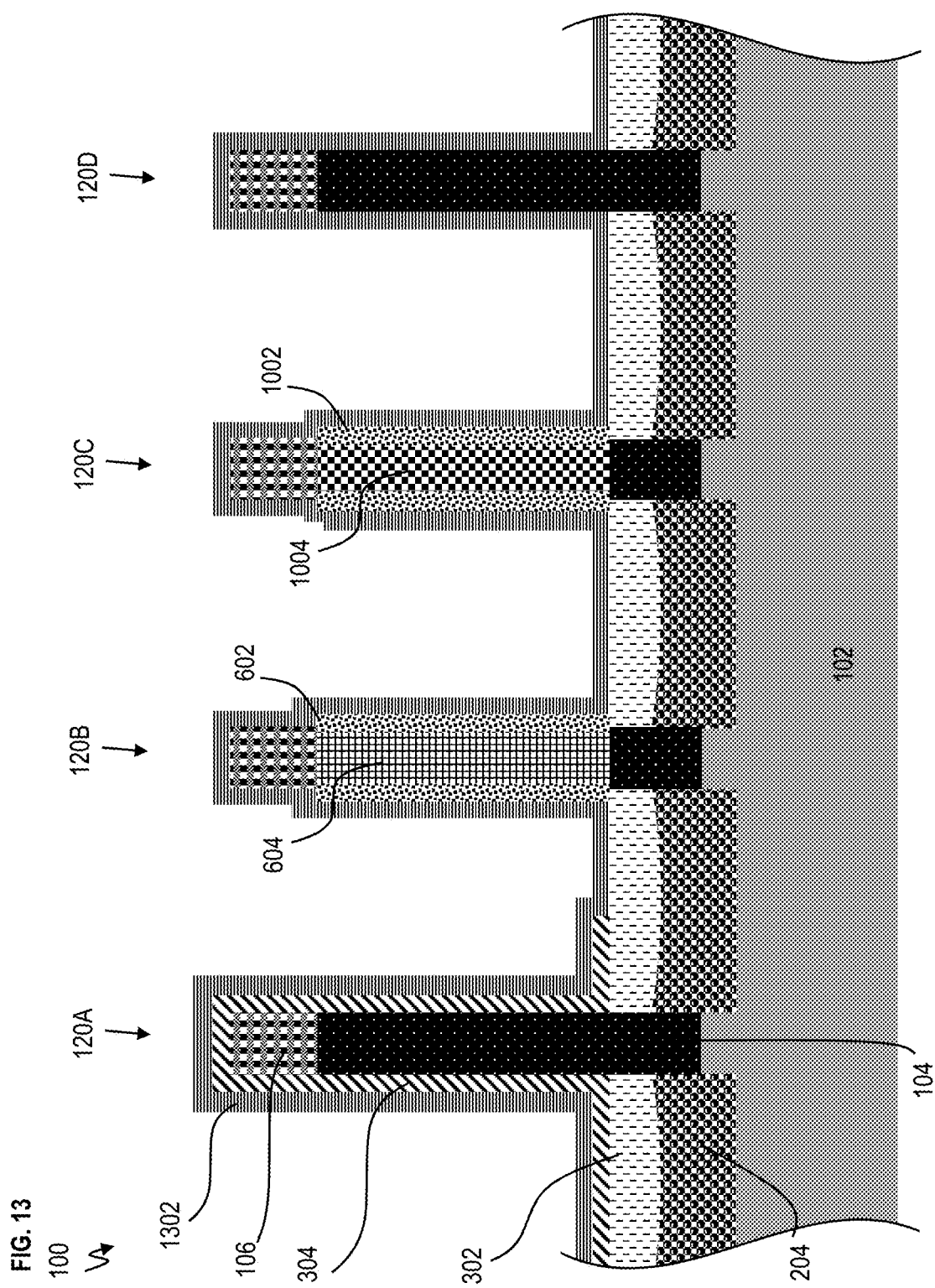
FIG. 13 depicts a cross-sectional view of the semiconductor structure after fabrication operations according to embodiments of the invention.

FIG. 13 depicts a cross-sectional view of the semiconductor device 100 according to embodiments of the invention. Analogous to FIGS. 5 and 9, germanium oxide deposition is performed. For example, the block mask 1202 is removed. The block mask 1202 can be removed using, for example, plasma etch. After the block mask 1202 is removed, conformal deposition of a reaction layer 1302 is performed. The reaction layer 1302 can be deposited using any conformal deposition process, such as ALD. The thickness of the reaction layer 1302 can be about 7 nm to 8 nm. The reaction layer 1302 is germanium oxide ($GeO_2$). Another example of the reaction layer 1302 can be a mixture of germanium oxide ($GeO_2$) and silicon oxide ($SiO_2$), although $GeO_2$ might be more effective. The reaction layer 1302 in FIG. 13 is analogous to the reaction layers 502 and 902 described in FIGS. 5 and 9, respectively. However, it is noted that the $GeO_2$ thickness (e.g., 7-8 nm) of the reaction layer 1302 is thicker than first $GeO_2$ deposition thickness (3-4 nm) of reaction layer 502 in FIG. 5 and the second $GeO_2$ deposition thickness (5-6 nm) of reaction layer 902 in FIG. 9, thereby providing more chemical reactions of SiGe and $GeO_2$. As such, the concentration of Ge is greater in device 120D after annealing as depicted in FIG. 14, thereby resulting in the lowest threshold voltage in device 120D as discussed further below.

Referring to FIG. 13, in device 120D, the exposed SiGe fin is directly contacting the ($GeO_2$) reaction layer 1302. The other SiGe fin of channel layer 104 in device 120A is still covered by fin liner 304 such that the reaction layer 1302 covers the fin liner 304, while the fin of modified channel layer 604 of device 120B is covered by converted layer 602 such that the reaction layer 1302 covers the converted layer 602 and while the fin of modified channel layer 1004 of device 120C is covered by converted layer 1002 such that the reaction layer 1302 covers the converted layer 1002. In this case, the material of channel layer 104 is directly covered by the reaction layer 1302 in device 120D, while the material of channel layer 104, channel layer 604, and channel layer 1004 is protected in devices 120A, 120B, and device 120C, respectively.

Figure 14:
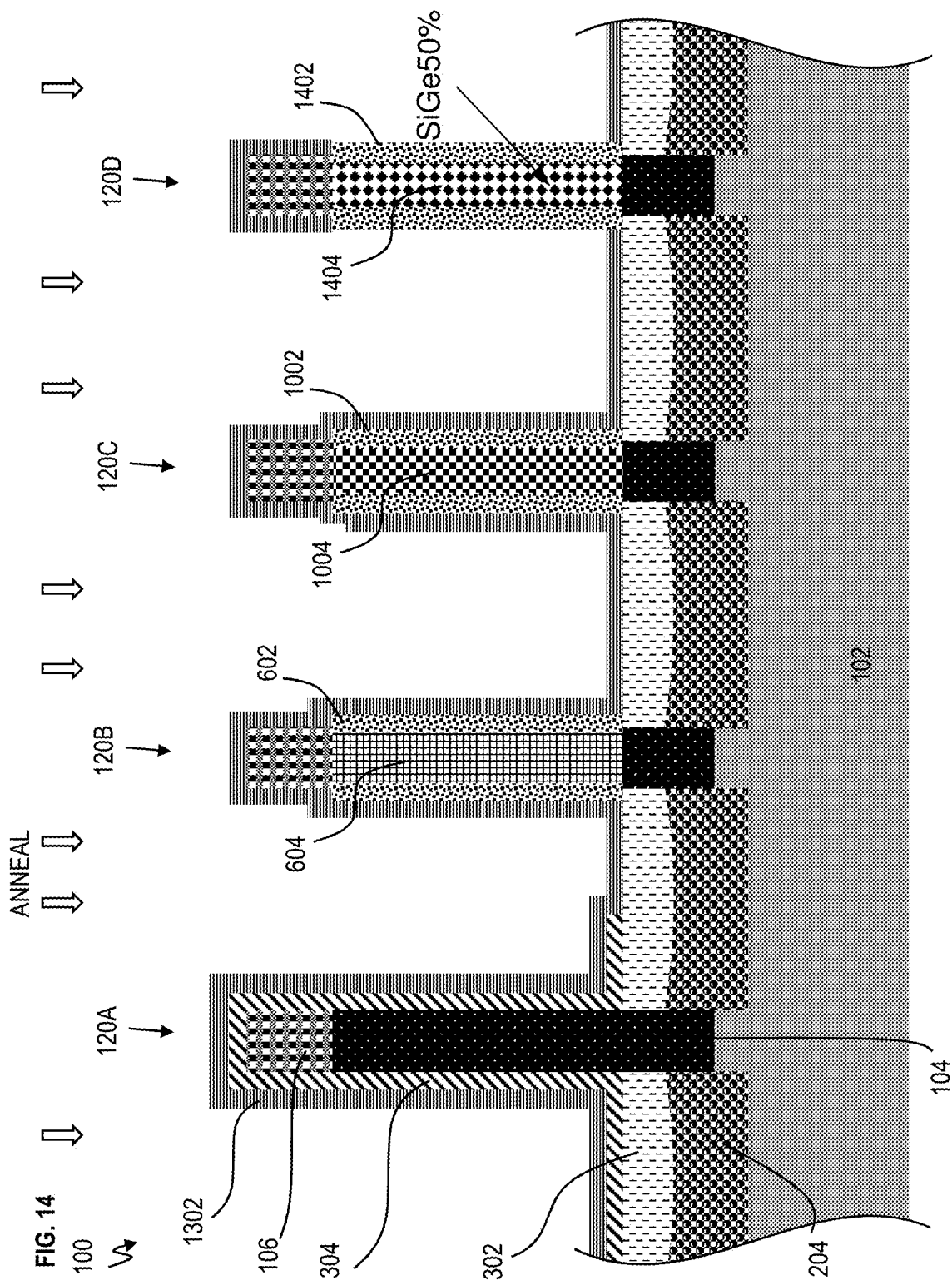
FIG. 14 depicts a cross-sectional view of the semiconductor structure after fabrication operations according to embodiments of the invention.

FIG. 14 depicts a cross-sectional view of the semiconductor device 100 according to embodiments of the invention. Analogous to FIGS. 6 and 10, the third selective Ge condensation is performed. For example, annealing is performed to cause the third selective Ge condensation which changes the Ge concentration in the exposed SiGe fin of device 120D. After the chemical reaction of the SiGe and $GeO_2$ interface, the Ge is condensed and $GeO_2$ converts to $SiO_2$. In particular, a chemical reaction occurs between the exposed fin of the SiGe channel layer 104 and the $GeO_2$ reaction layer 1302 in device 120D, which converts the reaction layer 1302 into converted layer 1402 and converts channel layer 104 into modified channel layer 1404. Accordingly, the fin in device 120D now contains the modified channel layer 1404 which has been formed to have a higher concentration of germanium than the previous channel layer 104. In this example, the modified channel layer 1004 can be $SiGe_j$ where the atomic percent of j is about 50%, i.e., $SiGe_{50\%}$. The converted layer 1402 is on the modified channel layer 1404, and the converted layer 1402 is formed into an oxide based material, such as, for example, $SiO_2$.

The Ge condensation causes the Ge concentration in the modified channel layer 1404 to be increased in device 120D, thereby decreasing the threshold voltage. The chemical reaction is described in the table discussed above. As noted above, this chemical reaction occurs in an inert gas ambient for temperatures ranges from about 500° C. to about 700° C. The materials of the inert gas can include, for example, $N_2$, Ar, He, and/or any other mixture these gases.

As can be seen in FIG. 14, the top portion of the reaction layer 1302 on the fin does not chemically react with the hardmask layer 106 of device 120D and thus the top portion of the device 120D remains unreacted. Similarly, the reaction layer 1302 on the fins in devices 120A, 120B, and 120C is unreacted such that these devices are not modified by the Ge condensation in FIG. 14. As discussed herein, the threshold voltage (Vt) can be controlled by Ge concentration in the SiGe channel. Accordingly, the device 120D has a modified threshold voltage as discussed herein.

Figure 15:
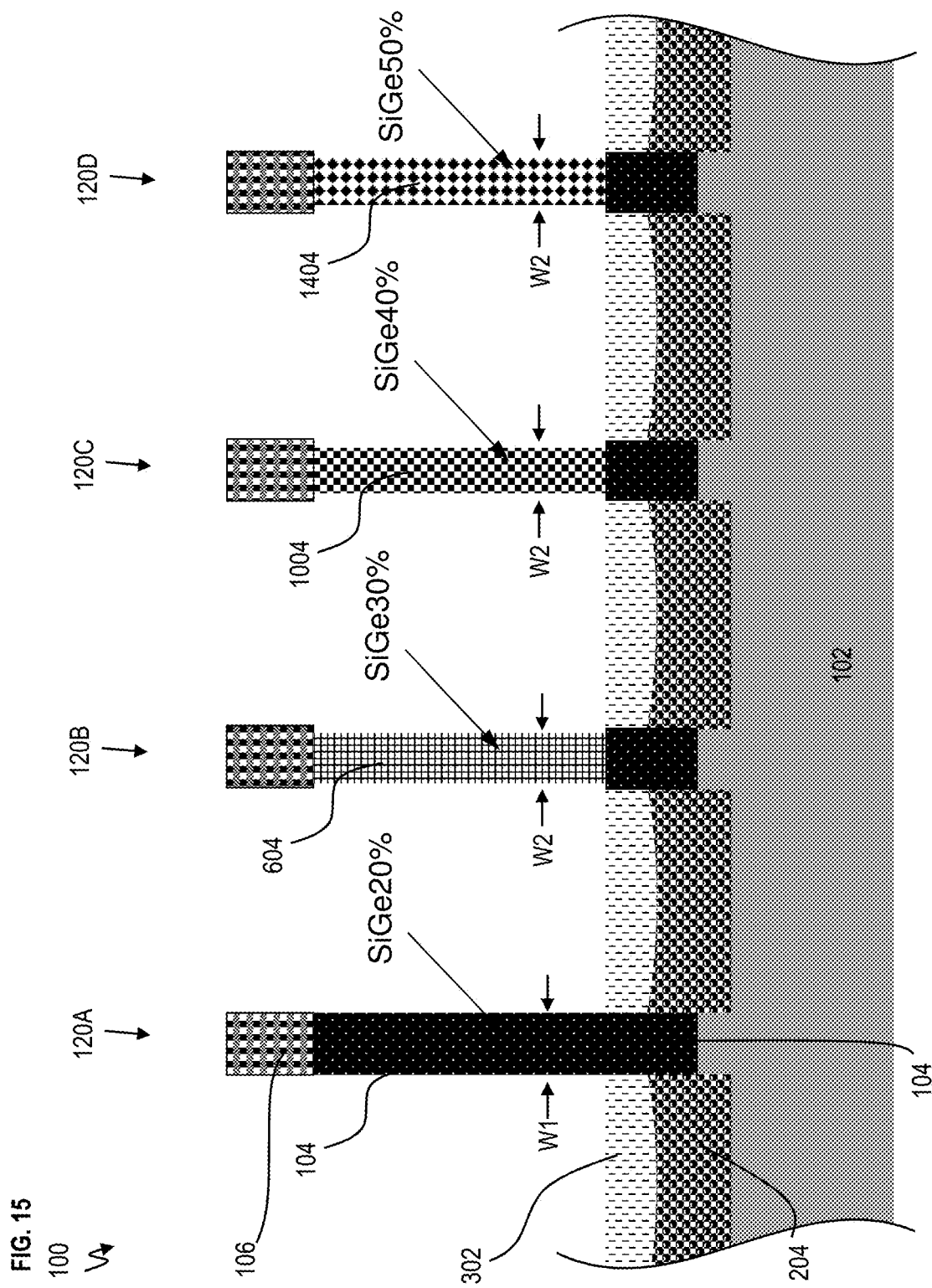
FIG. 15 depicts a cross-sectional view of the semiconductor structure after fabrication operations according to embodiments of the invention.

FIG. 15 depicts a cross-sectional view of the semiconductor device 100 according to embodiments of the invention. Analogous to FIGS. 7 and 11, the unreacted reaction layer 1302 on the fin liner 304, fin hardmask 106, and the bottom spacer 302 is removed. As noted above, the reaction layer 1302 can be removed by a water wash, such as a deionized water wash. Also, FIG. 15 depicts device 120A having fins of channel layer 104 containing, for example, $SiGe_{20\%}$, the device 120B having a fin with the modified channel layer 604 containing, for example, $SiGe_{30\%}$, the device 120C having a fin with the modified channel 1004 containing, for example, $SiGe_{40\%}$, and last the device 120D having a fin with the modified channel 1404 containing, for example, $SiGe_{50\%}$. Unreacted $GeO_2$ and fin liner 304 are removed by wet etch, for example, using hydrofluoric acid (HF) or dilute hydrofluoric acid (DHF). Now, there are different Ge concentrations in the SiGe fins of the transistors. As such, each of the devices 120A, 120B, 120C, and 120D has a different Ge concentration level in their respective channels 104, 604, 1004, and 1404, respectively. The width W1 of the channel layer 104 of the fin in device 120A is wider than the width W2 of the modified channel layers 604, 1004, and 1404 in the fins of devices 120B, 120C, 120D, when originally each of the transistors had the same width W1. The slight reduction in width from W1 to W2 is caused by the chemical reaction during Ge condensation.

Figure 16:
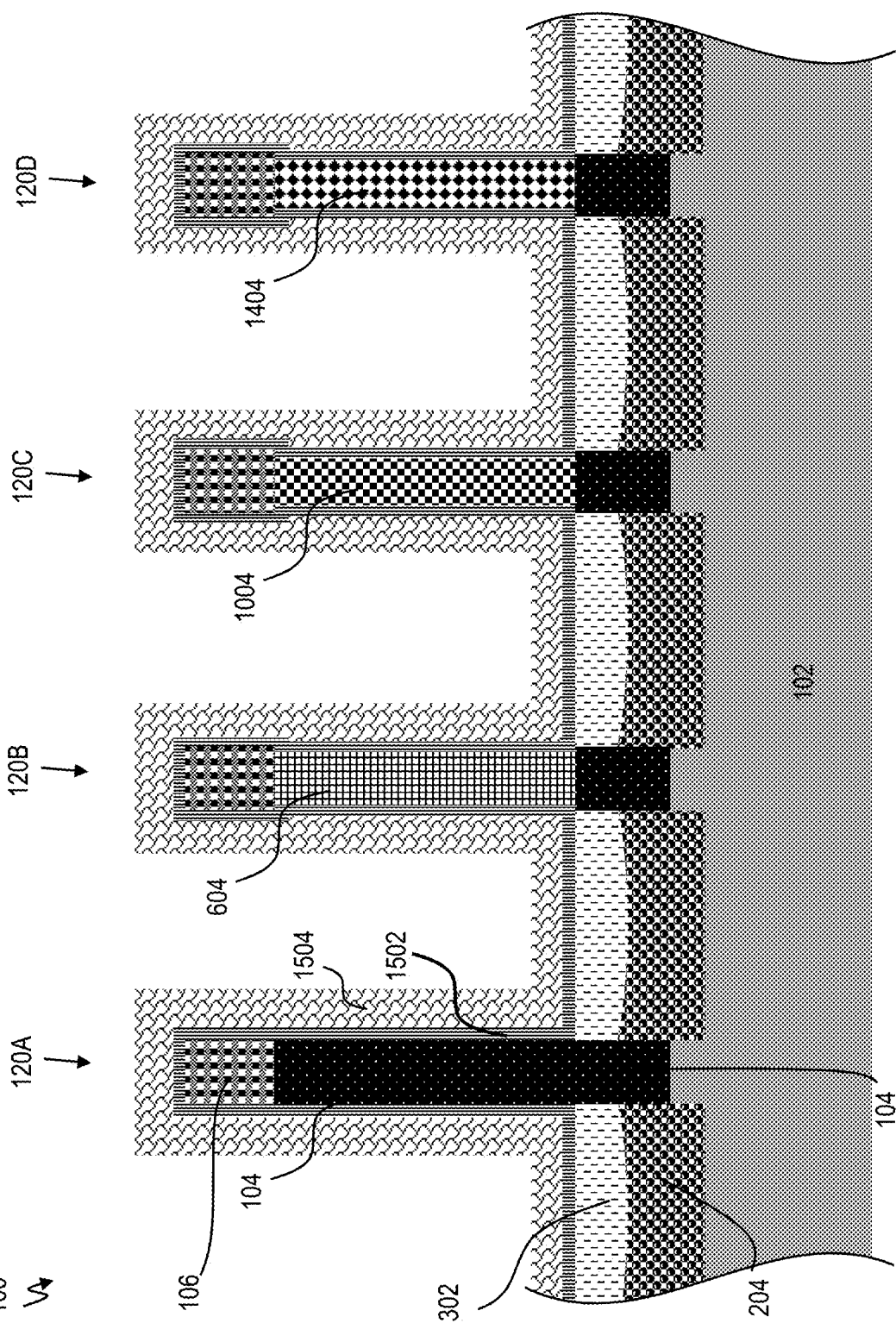
FIG. 16 depicts a cross-sectional view of the semiconductor structure after fabrication operations according to embodiments of the invention.

FIG. 16 depicts a cross-sectional view of the semiconductor device 100 according to embodiments of the invention. High-k and work function metal (WFM) deposition is performed. A common gate stack can be formed with an interfacial layer (IL)/high-k/WFM. The IL can be optional and is not shown. A dielectric layer 1502 is formed on the channel layers 104, 604, 1004, and 1404, and the dielectric layer 1502 is a high-k material. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include a dopant such as lanthanum or aluminum. High-k dielectric materials can have a dielectric constant greater than 3.9, 7.0, or 10.0.

One or more work function metals (WFM) 1504 can be formed on top of the dielectric layer 1502. It is noted that the thickness of the dielectric layer 1502 is the same on each of the devices 120A, 120B, 120C, and 120D. Similarly, the thickness of the work function metals 1504 is the same on each of the devices 120A, 120B, 120C, 120D, although the devices 120A, 120B, 120C, and 120D each have a different threshold voltage. Work function metals can be for a PFET or NFET. Example NFET work function metals can include TiN, TiAlC, TiAlN, etc. Example PFET work function metals can include TiN, TaN, and others.

Figure 17:
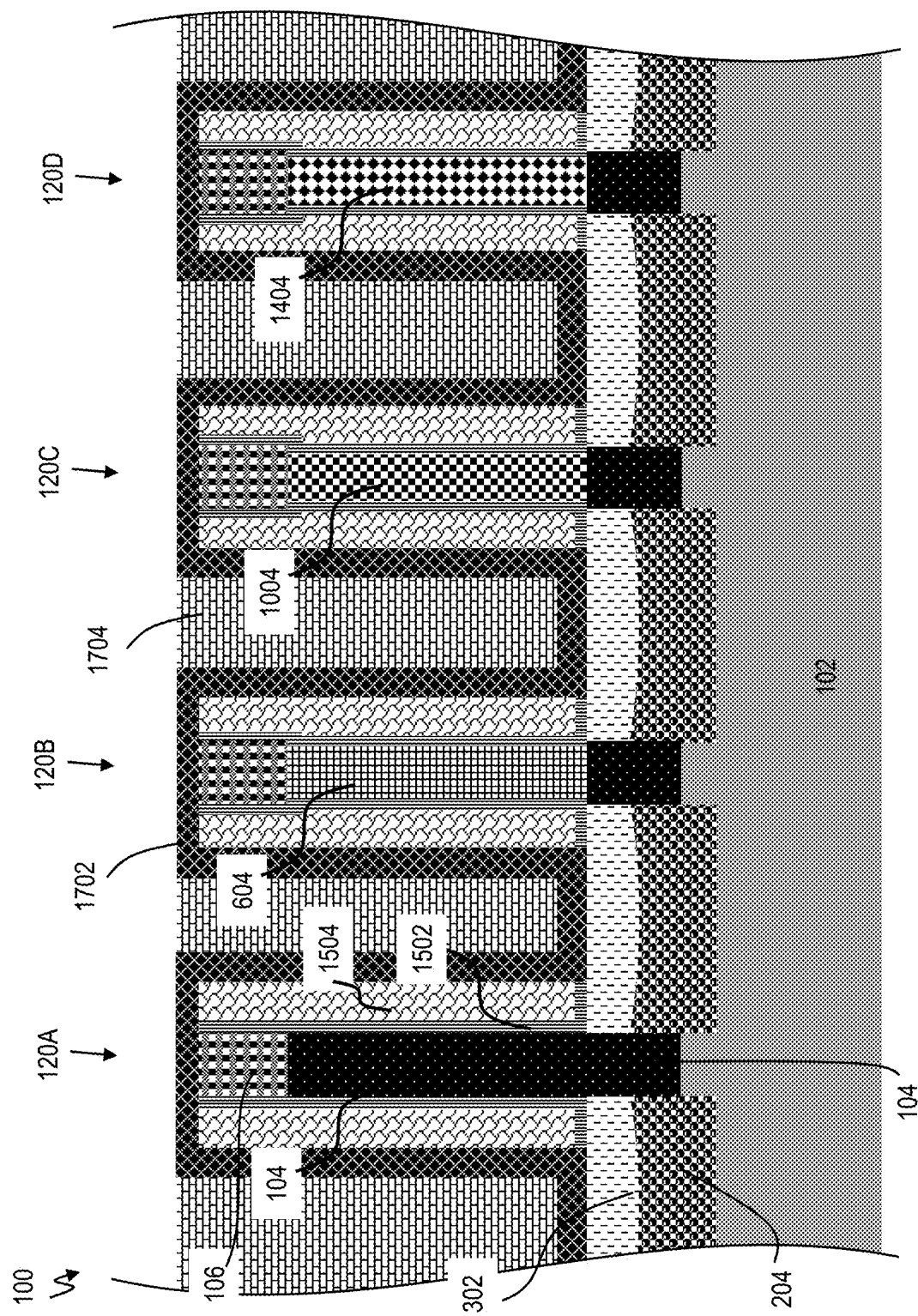
FIG. 17 depicts a cross-sectional view of the semiconductor structure after fabrication operations according to embodiments of the invention.

FIG. 17 depicts a cross-sectional view of the semiconductor device 100 according to embodiments of the invention. Self-aligned gate etching (RIE) is performed to sever the electrical and physical connection of devices 120A, 120B, 120C, 120D, by removing portions of the work function metals 1504 along with the dielectric layer 1502. Additionally, gate encapsulation is performed. For example, a gate encapsulation layer 1702 is formed on the WFM 1504, dielectric layer 1502, hardmask layer 106, and bottom spacer 302. The gate encapsulation layer 1702 can be a nitride based material, such as, for example silicon nitride (SiN). A fill material 1704 is deposited, and chemical mechanical polishing/planarization is performed. The fill material 1704 can be an oxide based material, such as, $SiO_2$.

FIG. 18 depicts a cross-sectional view of the semiconductor device 100 according to embodiments of the invention. Selective etching is performed to remove the gate encapsulation layer 1702 on the top of the devices 120A, 120B, 120C, and 120D. Gate recess is performed by, for example, removing the hardmask layer 106 and recessing both the dielectric layer 1502 and the WFM 1504 using a wet chemical etch, without etching the fins. The etching forms openings 1802 above each of the devices 120A, 120B, 120C, 120D.

FIG. 19 depicts a cross-sectional view of the semiconductor device 100 according to embodiments of the invention. A top spacer 1902 is formed on top of the dielectric layer 1502 and the WFM 1504. The top spacer 1902 can be a nitride based material, such as, for example, SiN. The top spacer 1902 can be deposited by divot fill followed by etch. A top source/drain region 1904 is formed by epitaxial growth. The material of the top source/drain region 1904 can be SiGe doped with B (i.e., SiGe:B). FIG. 19 illustrates the semiconductor device 100 with the four VFET devices 120A, 120B, 120C, 120D, each having a different threshold voltage. The VFET device 120A has the highest threshold voltage, the VFET device 120B has a regular threshold voltage, the VFET device 120C has a low threshold voltage, and the VFET device 120D has a very low threshold voltage, with respect to one another. The threshold voltage has an inverse relationship to the Ge concentration in the respective fins. In other words, the threshold voltage decreases with an increase in Ge concentration in the fins of the VFET devices 120A, 120B, 120C, and 120D.

Although the SiGe channel layers of the fins are illustrated as having $SiGe_{20\%}$, $SiGe_{30\%}$, $SiGe_{40\%}$, and $SiGe_{50\%}$ for transistor devices 120A, 120B, 120C, and 120D, respectively, embodiments of the invention are not meant to be limited to the exact atomic percent of germanium. It should be appreciated that example scenarios are provided for illustration and explanation purposes. More or fewer transistor devices can be formed on the semiconductor device 100 where each transistor or groups transistors have different threshold voltages from other individual transistors or groups of transistors according to techniques discussed herein. Further, the atomic percent of germanium in $SiGe_{x\%}$, $SiGe_{y\%}$, $SiGe_{z\%}$, $SiGe_{j\%}$ can be different concentrations of germanium such that the relationship of $x<y<z<j$ holds true, and this relationship holds true for different ranges of x, y, z, and j even if the ranges happened to overlap. For example, the atomic percent of germanium for x can range from 10-25%, for y can range from about 25-35%, for z can range from about 35-45%, and j can range from about 45-55% such that the particular atomic percent of germanium selected in the ranges for x, y, z, and j maintains the relationship of $x<y<z<j$ and the selections do not overlap, thereby forming different threshold voltages on the same semiconductor device 100.

According to embodiments of the invention, a method of forming a semiconductor device 100 is provided. The method includes forming fins of varying concentrations of germanium and forming gate material (e.g., high-k material 1502 and/or WFM 1504) on the fins, where source or drain (S/D) regions (e.g., bottom S/D regions 204 and/or top S/D regions 1904) are adjacent to the fins, and wherein transistor devices (e.g., transistor devices 120A, 120B, 120C, and/or 120D) include the fins.

Predefined threshold voltages (e.g., from high Vt, regular Vt, low Vt, to very low Vt) are defined by differences in the concentrations of germanium. The fins include the concentrations of germanium at predefined levels (e.g., from highest, higher, low, to lowest predefined levels of germanium). Each of the predefined levels is associated with a different threshold voltage (e.g., from high Vt, regular Vt, low Vt, to very low Vt) for the transistor devices.

The transistor devices (e.g., transistor devices 120A, 120B, 120C, and/or 120D) include a plurality of threshold voltages. The transistor devices (e.g., transistor devices 120A, 120B, 120C, and/or 120D) include different threshold voltages according to the concentrations of germanium (e.g., lowest concentration of Ge, low concentration of Ge, high concentration of Ge, and/or highest concentration of Ge). Threshold voltages of the transistor devices have an inverse relationship to the concentrations of germanium in the fins. A greater concentration of germanium (e.g., a higher atomic percent % of Ge) is associated with a lower threshold voltage while a lower concentration of germanium (e.g., a lower atomic percent % of Ge) is associated with a higher threshold voltage. In other words, the threshold voltage of the transistor devices 120A, 120B, 120C, and/or 120D proportionately decreases with an increase in concentration of Ge in their respective (SiGe) vertical channels.

The transistor devices 120A, 120B, 120C, and/or 120D include the same thickness of the gate material (e.g., high-k material 1502 and/or WFM 1504). A work function material 1504 of the gate material has the same thickness in each of the transistor devices 120A, 120B, 120C, and/or 120D, i.e., zero-thickness variation of the WFM 1504. The transistor devices include multiple threshold voltages.

According to embodiments of the invention, a method of forming a semiconductor device 100 is provided. The method includes forming fins with a first concentration of germanium (e.g., in transistor device 120A), increasing the germanium in at least one of the fins to a second concentration (e.g., in transistor device 120B), increasing the germanium in at least another one of the fins to a third concentration (e.g., in transistor device 120C), and forming gate material on the fins. The transistor devices respectively include the fins, and the transistor devices include different threshold voltages defined by the first, second, and third concentrations of the germanium. The third concentration of the germanium is greater than (>) the second concentration, and the second concentration of germanium is greater than (>) the first concentration.

Terms such as "epitaxial growth" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a semiconductor device, the method comprising:
    forming fins of varying concentrations of germanium, one of the fins having a greatest width comprises material having a least concentration of germanium, the fins each comprising a bottom region formed of the material having the least concentration of germanium, wherein the fins comprise varying widths; and
    forming gate material on the fins, wherein source or drain (S/D) regions are adjacent to the fins, and wherein transistor devices comprise the fins.

2. The method of claim 1, wherein predefined threshold voltages are defined by differences in the concentrations of germanium, another one of the fins comprising a different concentration of germanium being formed on the bottom region having the material, a further one of the fins comprising a further different concentration of germanium being formed on the bottom region having the material.

3. The method of claim 1, wherein the fins comprise the concentrations of germanium at predefined levels; and
    wherein the fins comprise varying widths as compared to other fins.

4. The method of claim 3, wherein each of the predefined levels is associated with a different threshold voltage for the transistor devices.

5. The method of claim 1, wherein the transistor devices comprise a plurality of threshold voltages.

6. The method of claim 1, wherein the transistor devices comprise different threshold voltages according to the concentrations of germanium.

7. The method of claim 1, wherein threshold voltages of the transistor devices have an inverse relationship to the concentrations of germanium in the fins.

8. The method of claim 1, wherein a greater concentration of germanium is associated with a lower threshold voltage while a lower concentration of germanium is associated with a higher threshold voltage.

9. The method of claim 1, wherein the transistor devices comprise a same thickness of the gate material.

10. The method of claim 1, wherein a work function material of the gate material has a same thickness in the transistor devices.

11. The method of claim 10, wherein the transistor devices comprise multiple threshold voltages.

12. A semiconductor device comprising:
    fins comprising varying concentrations of germanium, one of the fins having a greatest width comprises material having a least concentration of germanium, the fins each comprising a bottom region formed of the material having the least concentration of germanium, wherein the fins comprise varying widths; and
    gate material formed on the fins, wherein source or drain (S/D) regions are adjacent to the fins, and wherein transistor devices comprise the fins.

13. The semiconductor device of claim 12, wherein predefined threshold voltages are defined by differences in the concentrations of germanium.

14. The semiconductor device of claim 12, wherein the fins comprise the concentrations of germanium at predefined levels; and
    wherein the fins comprise varying widths as compared to other fins.

15. The semiconductor device of claim 14, wherein each of the predefined levels is associated with a different threshold voltage for the transistor devices.

16. The semiconductor device of claim 12, wherein threshold voltages of the transistor devices have an inverse relationship to the concentrations of germanium in the fins.

17. The semiconductor device of claim 12, wherein the transistor devices comprise a same thickness of the gate material.

18. The semiconductor device of claim 12, wherein a work function material of the gate material has a same thickness in the transistor devices.

19. A method of forming a semiconductor device, the method comprising:
    forming fins with a first concentration of germanium, one of the fins having a greatest width comprises material having a least concentration of germanium, the fins each comprising a bottom region formed of the material having the least concentration of germanium;
    increasing the germanium in at least one of the fins to a second concentration;
    increasing the germanium in at least another one of the fins to a third concentration; and
    forming gate material on the fins, wherein transistor devices comprise the fins, wherein the transistor devices comprise different threshold voltages defined by the first, second, and third concentrations of the germanium, and wherein the fins comprise varying widths.

20. The method of claim 19, wherein the third concentration of the germanium is greater than the second concentration, and the second concentration is greater than the first concentration.

* * * * *